(12) United States Patent
Rathsack et al.

(10) Patent No.: US 7,673,278 B2
(45) Date of Patent: Mar. 2, 2010

(54) ENHANCED PROCESS YIELD USING A HOT-SPOT LIBRARY

(75) Inventors: Benjamen M. Rathsack, Austin, TX (US); Kathleen Nafus, Leuven (BE); Steven Scheer, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 314 days.

(21) Appl. No.: 11/947,234

(22) Filed: Nov. 29, 2007

(65) Prior Publication Data

US 2009/0144691 A1 Jun. 4, 2009

(51) Int. Cl.
*G06F 17/50* (2006.01)
(52) U.S. Cl. .................. 716/19; 716/1; 716/4
(58) Field of Classification Search ........... 716/1, 716/4, 19
See application file for complete search history.

(56) References Cited

U.S. PATENT DOCUMENTS

| | | | |
|---|---|---|---|
| 6,046,792 A | 4/2000 | Van Der Werf et al. | |
| 6,563,566 B2 | 5/2003 | Rosenbluth et al. | |
| 6,977,715 B2 | 12/2005 | Wu | |
| 7,090,964 B2 | 8/2006 | Baba-Ali et al. | |
| 7,111,276 B2 | 9/2006 | Kamat et al. | |
| 7,126,668 B2 | 10/2006 | Smith et al. | |
| 7,172,838 B2 | 2/2007 | Maurer et al. | |
| 7,194,725 B1 | 3/2007 | Lukanc et al. | |
| 2004/0143423 A1* | 7/2004 | Parks et al. | 702/194 |
| 2004/0265707 A1 | 12/2004 | Socha | |
| 2005/0134822 A1 | 6/2005 | Socha et al. | |
| 2006/0152696 A1 | 7/2006 | Boogaard et al. | |
| 2006/0192930 A1 | 8/2006 | Iimura et al. | |
| 2007/0024834 A1 | 2/2007 | Smith et al. | |
| 2007/0059615 A1 | 3/2007 | Op de Beeck | |
| 2007/0079278 A1 | 4/2007 | Tanaka et al. | |
| 2007/0081137 A1 | 4/2007 | Lin | |
| 2008/0183413 A1* | 7/2008 | Deshpande et al. | 702/99 |
| 2008/0241969 A1* | 10/2008 | Winkler et al. | 438/5 |
| 2008/0243295 A1* | 10/2008 | Winkler et al. | 700/121 |
| 2009/0082983 A1* | 3/2009 | Yamashita et al. | 702/83 |

* cited by examiner

*Primary Examiner*—Jack Chiang
*Assistant Examiner*—Magid Y Dimyan

(57) ABSTRACT

The invention provides apparatus and methods for processing substrates using a hot-spot library.

8 Claims, 8 Drawing Sheets

600

ENHANCED PROCESS YIELD USING A HOT-SPOT LIBRARY

BACKGROUND OF THE INVENTION

1. Field of the Invention

The present invention relates to substrate processing, and more particularly to improving the process yield using hot-spot procedures and data.

2. Description of the Related Art

Many multiple patterning techniques are currently being use during semiconductor substrate processing to increase the number of features and/or structures within devices on a substrate. Multiple patterning techniques can include double exposure techniques, double patterning techniques, spacer techniques, mask techniques, and brute force techniques. In 2006, the International Technology Roadmap for Semiconductors roadmap was expanded to include double patterning a potential solution for 32 nm lithography. Multiple patterning techniques are viewed as some device manufacturers as bridge solutions that can be used until Extreme Ultra-Violet (EUV) techniques become more fully developed.

Integrated Circuit (IC) design shrinks push the limits of lithography resolution. Chemical processes become more sensitive to defects or patterning errors when pushed to the lithography limits. IC manufactures have historically used lithography simulations and CD SEM measurements to determine the focus and dose latitude as a means to determine design rules. Optical proximity correction for mask sizing is typically driving by CD SEM measurements for absolute dimensional targeting. In addition, yield enhancement is currently being performed using defect inspection tools that are typically separated from the lithography simulation based techniques that are used for mask at each IC layer.

SUMMARY OF THE INVENTION

The invention can provide apparatus and methods of processing a substrate in real-time using hot-spot procedures, models, and libraries to improve process yield.

Other aspects of the invention will be made apparent from the description that follows and from the drawings appended hereto.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
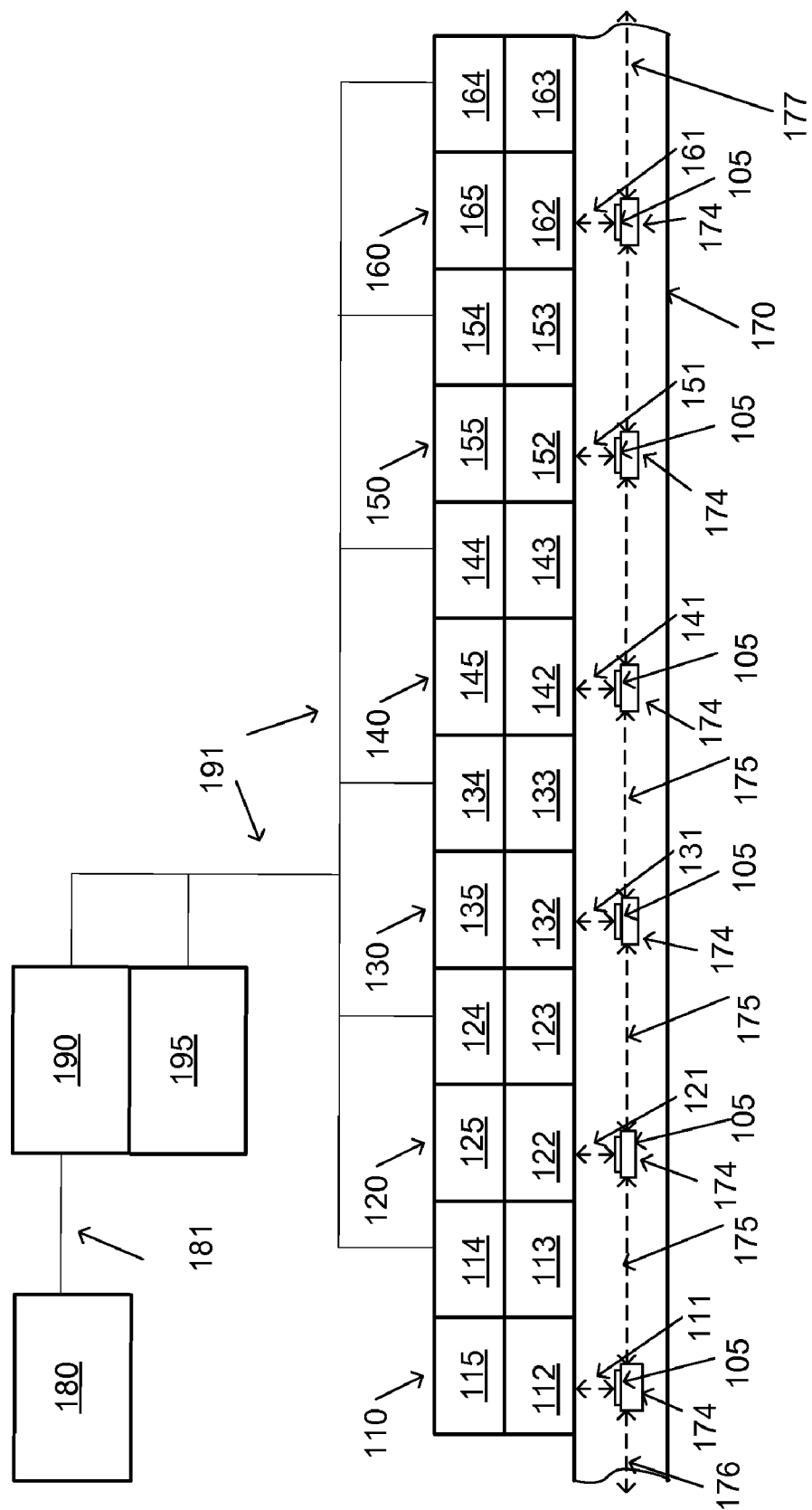
FIG. 1 shows an exemplary block diagram of a processing system in accordance with embodiments of the invention.

The invention provides apparatus and methods for processing substrates using process-related hot-spot libraries. The invention provides an Electronic Design Automation (EDA) methodology that correlates process-related hot-spots (resist bridging, watermark, etc) measured from a specific imaging/chemical process to simulated lithography contrast data, such as Normalized Image Log Slope (NILS) values. Simulated contrast data can be used to create, refine, and verify circuit design or layout rules for specific integrated circuit layers based on the predicted yield from calibrated hot-spot measurements.

In some embodiments, lithography simulation can be used to generate illumination conditions that stress the contrast data and corresponding process latitude, and the imaging illumination conditions can transition from poor contrast (image in resist NILS~0.3) to good contrast (image in resist NILS>1). When process-related hot-spot library data is required, process experiments can be run with test design layouts to correlate the hot-spot levels for specific track process (resist, rinse, top-coat, develop, bake) to the simulated data. The design test layouts can be either dense pitch lines or spaces (metal/STI, contact, via) or two-dimensional layouts like gate memory cell line end spaces. The hot-spot levels are measured over an appropriate design layout area for each test condition to generate good statistics (i.e. hot-spots/area or hot-spots/space run length). The hot-spot data can be correlated to the simulated contrast data to provide a calibration curve that can be used to relate process yield to specific integrated circuit dimensions. Contrast data can be obtained by using one or more imaging perturbations such as numerical aperture, partial coherence, focus, dose, mask size, or mask phase shift technology like attenuated or alternating. This calibration curve can then be used in EDA software to adjust design rule spaces, lines or holes (polygon edges) to meet specific yield targets. Specifically, lithography simulation is applied to complex 2D design layouts to determine the contrast data at each polygon edge segment (defined by user). If the contrast data is below specific threshold point, the polygon segment is adjusted, so that, the new polygon region generates simulated contrast data above a threshold value. The threshold value is determined from the calibrated contrast data vs. hot-spot curve based on process yield goals. This EDA methodology is a valuable Design for Manufacturing (DFM) tool that can be used to calibrate process yield in early process development or further optimize processes already in production.

One of the EDA software techniques disclosed herein relates a lithography simulation image parameter (IP) obtained from a design layout to measured hot-spots (defects) that are specific to a user's tool set (scanner and track) as well as their chemical process (resist selection, track bake, track rinse, track develop, etc). In addition, an IP vs. hot-spot calibration curve can provide a statistical fingerprint of the process yield behavior. The statistical nature of the hot-spot measurements (per area or per run length) seeks to capture a much larger scale of process variations (tool/process) than just individual metrology measurements that are traditional used to set design/mask rules today. Furthermore, process calibration curves (image parameters vs. hot-spots) can also be generated for new process integration approaches that generate new types of pattern hot-spots like (ex metal base poisoning from dual damascene, STI field oxide variation, metal gate substrate variations, immersion lithography, double patterning lithography). Furthermore, the IP vs. hot-spot calibration approach can be used to improve yields/robustness for specific tools/processes. When a process is run at a contrast threshold condition (IP threshold), it becomes very sensitive to small statistical process effects that might not be as easily partitioned when operating at high contrast conditions. In some cases, the inflection point in the IP vs. hot-spot curve can be defined as the IP threshold condition. The IP threshold condition can be used to establish the point between good and bad imaging data, and can be used in track, scanner or integration experiments to improve yield. The tool or process conditions can be optimized at the IP threshold condition, which then can be transferred as a more robust process to a higher yield manufacturing process.

In some embodiments, an EDA methodology is provided that enables a "process calibrated" prediction of process yields for large IC design layouts. The IP to hot-spot calibration enables designers or layout engineers to adjust designs to provide better yield (DFM). This EDA technique and associated process-related hot-spot library can be applied by a user in real-time without fully understanding the process. The EDA methodology focuses on the "statistical" nature of process error and hot-spot generation as an input into design rules. For example, some of the other models currently being used in the industry only get calibrated using CD metrology tools. In addition, the IP to hot-spot calibration process can be done using an older illumination technology while still providing predictions for a next generation process. However, the process calibration must be made with a very similar chemical process.

The process-related hot-spot library data and the hot-spot calibrated IP simulations are only as accurate as the calibrated procedures. For example, when a test reticle/mask is used, it is fabricated with the appropriate structures required for the calibration procedures and when it is used the range of illumination conditions are established to provide an IP range from good to bad. Furthermore, hot-spot inspections can be performed for each IP condition. Hot-spot classification can be provided using finely tuned models.

One or more evaluation fields and/or sites can be identified at various locations on a substrate and can be used to generate and/or verify process-related hot-spot data. Substrates and layouts can have real-time and historical data associated with them, and the real-time and historical data can include hot-spot data, process defect data, process-related data, confidence data and/or risk data for one or more of the hot-spot images, patterns and/or sites, site ranking data, transferring sequence data, or process-related data, or evaluation/verification-related data, or any combination thereof. Processing sequences can also be established for each substrate and/or layout.

In some examples, the substrates can have other layers deposited on them by a previous process or an external system, and the processing sequences can include one or more lithography-related procedures, one or more scanner-related procedures, one or more evaluation procedures, and one or more transfer sequences. For example, transfer sequences can be established based on the number of substrates that require lithography-related processing, the number of substrates that require scanner-related processing, the number of available processing elements, the number of substrates that require evaluation, the number of available evaluation elements, and the loading data for one or more of the subsystems.

As structure sizes decrease below the 65 nm node, accurate processing and/or measurement data becomes more important and more difficult to obtain. Hot-spot-related procedures can be used to more accurately and efficiently produce these ultra-small devices and structures. The data from a hot-spot-related procedure can be compared with the warning and/or control limits, when a run-rule is violated, an alarm can be generated indicating a processing problem, and real-time correction procedures can be performed.

FIG. 1 shows an exemplary block diagram of a processing system in accordance with embodiments of the invention. In the illustrated embodiment, processing system 100 comprises a lithography subsystem 110, a scanner subsystem 120, an etch subsystem 130, a deposition subsystem 140, an inspection subsystem 150, a metrology subsystem 160, a transfer subsystem 170, a manufacturing execution system (MES) 180, a system controller 190, and a memory/database 195. Single subsystems (110, 120, 130, 140, 150, 160, and 170) are shown in the illustrated embodiment, but this is not required for the invention. In some embodiments, multiple subsystems (110, 120, 130, 140, 150, 160, and 170) can be used in a processing system 100. In addition, one or more of the subsystems (110, 120, 130, 140, 150,160, and 170) can comprise one or more processing elements that can be used to perform one or more hot-spot-related procedures.

The system controller 190 can be coupled to the lithography subsystem 110, the scanner subsystem 120, the etch subsystem 130, the deposition subsystem 140, the inspection subsystem 150, the metrology subsystem 160, and the transfer subsystem 170 using a data transfer subsystem 191. The system controller 190 can be coupled to the MES 180 using the data transfer subsystem 181. Alternatively, other configurations may be used. For example, the etching subsystem 130, the deposition subsystem 140, the metrology subsystem 160, and a portion of the transfer subsystem 170 can be part of a Tactras™ System available from Tokyo Electron Limited.

The lithography subsystem 110 can comprise one or more transfer/storage elements 112, one or more processing elements 113, one or more controllers 114, and one or more evaluation elements 115. One or more of the transfer/storage elements 112 can be coupled to one or more of the processing elements 113 and/or to one or more of the evaluation elements 115 and can be coupled 111 to the transfer subsystem 170. The transfer subsystem 170 can be coupled 111 to the lithography subsystem 110, and one or more substrates 105 can be transferred 111 between the transfer subsystem 170 and the lithography subsystem 110 in real time. For example, the transfer subsystem 170 can be coupled to one or more of the transfer/storage elements 112, to one or more of the processing elements 113, and/or to one or more of the evaluation elements 115. One or more of the controllers 114 can be coupled to one or more of the transfer/storage elements 112, to the one or more of the processing elements 113, and/or to one or more of the evaluation elements 115.

In some embodiments, the lithography subsystem 110 can perform coating procedures, thermal procedures, measurement procedures, inspection procedures, alignment procedures, and/or storage procedures on one or more substrates using procedures and /or procedures. For example, one or more lithography-related processes can be used to deposit one or more masking layers that can include photoresist material, and/or anti-reflective coating (ARC) material, and can be used to thermally process (bake) one or more of the masking layers. In addition, lithography subsystem 110 can be used to measure and/or inspect one or more of the masking layers and/or substrates.

The scanner subsystem 120 can comprise one or more transfer/storage elements 122, one or more processing elements 123, one or more controllers 124, and one or more evaluation elements 125. One or more of the transfer/storage elements 122 can be coupled to one or more of the processing elements 123 and/or to one or more of the evaluation elements 125 and can be coupled 121 to the transfer subsystem 170. The transfer subsystem 170 can be coupled 121 to the scanner subsystem 120, and one or more substrates 105 can be transferred 121 between the transfer subsystem 170 and the scanner subsystem 120 in real time. For example, the transfer subsystem 170 can be coupled to one or more of the transfer/storage elements 122, to one or more of the processing elements 123, and/or to one or more of the evaluation elements 125. One or more of the controllers 124 can be coupled to one or more of the transfer/storage elements 122, to the one or more of the processing elements 123, and/or to one or more of the evaluation elements 125.

In some embodiments, the scanner subsystem 120 can be used to perform wet and/or dry exposure procedures, and in other cases, the scanner subsystem 120 can be used to perform extreme ultraviolet (EUV) exposure procedures.

The etch subsystem 130 can comprise one or more transfer/storage elements 132, one or more processing elements 133, one or more controllers 134, and one or more evaluation elements 135. One or more of the transfer/storage elements 132 can be coupled to one or more of the processing elements 133 and/or to one or more of the evaluation elements 135 and can be coupled 131 to the transfer subsystem 170. The transfer subsystem 170 can be coupled 131 to the etch subsystem 130, and one or more substrates 105 can be transferred 131 between the transfer subsystem 170 and the etch subsystem 130 in real time. For example, the transfer subsystem 170 can be coupled to one or more of the transfer/storage elements 132, to one or more of the processing elements 133, and/or to one or more of the evaluation elements 135. One or more of the controllers 134 can be coupled to one or more of the transfer/storage elements 132, to the one or more of the processing elements 133, and/or to one or more of the evaluation elements 135. For example, one or more of the processing elements 133 can be used to perform plasma or non-plasma etching, ashing, and cleaning procedures, or plasma or non-plasma trimming procedures. Evaluation procedures and/or inspection procedures can be used to measure and/or inspect one or more surfaces and/or layers of the substrates.

The deposition subsystem 140 can comprise one or more transfer/storage elements 142, one or more processing elements 143, one or more controllers 144, and one or more evaluation elements 145. One or more of the transfer/storage elements 142 can be coupled to one or more of the processing elements 143 and/or to one or more of the evaluation elements 145 and can be coupled 141 to the transfer subsystem 170. The transfer subsystem 170 can be coupled 141 to the deposition subsystem 140, and one or more substrates 105 can be transferred 141 between the transfer subsystem 170 and the deposition subsystem 140 in real time. For example, the transfer subsystem 170 can be coupled to one or more of the transfer/storage elements 142, to one or more of the processing elements 143, and/or to one or more of the evaluation elements 145. One or more of the controllers 144 can be coupled to one or more of the transfer/storage elements 142, to the one or more of the processing elements 143, and/or to one or more of the evaluation elements 145. For example, one or more of the processing elements 143 can be used to perform physical vapor deposition (PVD) procedures, chemical vapor deposition (CVD) procedures, ionized physical vapor deposition (iPVD) procedures, atomic layer deposition (ALD) procedures, plasma enhanced atomic layer deposition (PEALD) procedures, and/or plasma enhanced chemical vapor deposition (PECVD) procedures. Evaluation procedures and/or inspection procedures can be used to measure and/or inspect one or more surfaces of the substrates.

The deposition subsystem 140 can comprise one or more processing elements 143 that can process, measure, inspect, align, and/or store one or more substrates. The transfer/storage elements 142 can transfer, measure, inspect, align, and/or store one or more substrates. In some embodiments, the deposition subsystem 140 can comprise one or more evaluation elements 145 that can perform inspection procedures, measurement procedures, alignment procedures, and/or storage procedures on one or more substrates.

The inspection subsystem 150 can comprise one or more transfer/storage elements 152, one or more processing elements 153, one or more controllers 154, and one or more evaluation elements 155. One or more of the transfer/storage elements 152 can be coupled to one or more of the processing elements 153 and/or to one or more of the evaluation elements 155 and can be coupled 151 to the transfer subsystem 170. The transfer subsystem 170 can be coupled 151 to the inspection subsystem 150, and one or more substrates 105 can be transferred 151 between the transfer subsystem 170 and the inspection subsystem 150 in real time. For example, the transfer subsystem 170 can be coupled to one or more of the transfer/storage elements 152, to one or more of the processing elements 153, and/or to one or more of the evaluation elements 155. One or more of the controllers 154 can be coupled to one or more of the transfer/storage elements 152, to the one or more of the processing elements 153, and/or to one or more of the evaluation elements 155.

The metrology subsystem 160 can comprise one or more transfer/storage elements 162, one or more processing elements 163, one or more controllers 164, and one or more evaluation elements 165. One or more of the transfer/storage elements 162 can be coupled to one or more of the processing elements 163 and/or to one or more of the evaluation elements 165 and can be coupled 161 to the transfer subsystem 170. The transfer subsystem 170 can be coupled 161 to the metrology subsystem 160, and one or more substrates 105 can be transferred 161 between the transfer subsystem 170 and the metrology subsystem 160 in real time. For example, the transfer subsystem 170 can be coupled to one or more of the transfer/storage elements 162, to one or more of the processing elements 163, and/or to one or more of the evaluation elements 165. One or more of the controllers 164 can be coupled to one or more of the transfer/storage elements 162, to the one or more of the processing elements 163, and/or to one or more of the evaluation elements 165.

The metrology subsystem 160 can comprise one or more evaluation elements 165 that can evaluate, measure, inspect, align, verify, and/or store one or more substrates. For example, one or more of the evaluation elements 165 can be used to perform real-time optical metrology procedures that can be used to evaluate hot-spot patterns and/or circuit layouts on the substrate.

The transfer subsystem 170 can comprise transfer elements 174 and transfer means (175, 176, and 177) that can be used to receive substrates, transfer substrates, align substrates, store substrates, and/or delay substrates. For example, the transfer elements 174 can support two or more substrates. Alternatively, other transferring means may be used. The transfer subsystem 170 can load, transfer, store, and/or unload substrates based on a processing sequence, a transfer sequence, operational states, the substrate and/or processing states, the processing time, the current time, the substrate data, the number of sites on the substrate, the type of sites on the substrates, the number of required sites, the number of completed sites, the number of remaining sites, or confidence data, or any combination thereof. For example, the sites on substrate can include hot-spot sites, target sites, overlay sites, alignment sites, measurement sites, verification sites, inspection sites, or damage-assessment sites, or any combination thereof.

In some examples, transfer system 170 can use loading data to determine where and when to transfer a substrate. In other examples, a transfer system can use hot-spot processing sequence data to determine where and when to transfer a substrate. Alternatively, other procedures may be used. For example, when the first number of substrates is less than or equal to the first number of available processing elements, the first number of substrates can be transferred to the first number of available processing elements in the one or more of the subsystems using the transfer subsystem 170. When the first number of substrates is greater than the first number of available processing elements, some of the substrates can be stored and/or delayed using one or more of the transfer/storage elements (112, 122, 132, 142, 152, and 162) and/or the transfer subsystem 170.

In addition, the one or more processing elements (113, 123, 133, 143, 153, and 163) can include one or more lithography-related components, one or more scanner-related components, one or more inspection-related components, one or more measurement-related components, one or more evaluation-related components, one or more etch-related components, one or more deposition-related components, one or more thermal processing components, one or more coating-related components, one or more alignment-related components, one or more polishing-related components, one or more storage-related components, one or more transfer components, one or more cleaning-related components, one or more rework-related components, one or more oxidation-related components, one or more nitridation-related components, or one or more external processing elements, or any combination thereof.

Operational state data can be established for the subsystems (110, 120, 130, 140, 150, 160, and 170) and can be used and/or updated by hot-spot-related procedures. In addition, operational state data can be established for the transfer/storage elements (112, 122, 132, 142, 152, and 162), processing elements (113, 123, 133, 143, 153, and 163), and evaluation elements (115, 125, 135, 145, 155, and 165), and can be updated by hot-spot-related procedures. For example, the operational state data for the processing elements can include availability data, matching data for the processing elements, expected processing times for some process steps and/or sites, yield data, confidence data and/or risk data for the processing elements, or confidence data and/or risk data for one or more hot-spot-related procedures. Updated operational states can be obtained by querying in real-time one or more processing elements, and/or one or more subsystems. Updated loading data can be obtained by querying in real-time one or more transfer elements, and/or one or more transfer subsystems.

One or more of the controllers (114, 124, 134, 144, 154, and 164) can be coupled to the system controller 190 and/or to each other using a data transfer subsystem 191. Alternatively, other coupling configurations may be used. The controllers can be coupled in series and/or in parallel and can have one or more input ports and/or one or more output ports. For example, the controllers may include 8-bit, 16-bit, 32-bit, and/or 64-bit processors having one or more core processing elements.

In addition, subsystems (110, 120, 130, 140, 150, 160, and 170) can be coupled to each other and to other devices using intranet, internet, wired, and/or wireless connections. The controllers (114, 124, 134, 144, and 190) can be coupled to external devices as required.

One or more of the controllers (114, 124, 134, 144, 154, 164, and 190) can be used when performing real-time hot-spot-related procedures. A controller can receive real-time data to update subsystem, processing element, process, recipe, profile, image, pattern, simulation, sequence data, and/or model data. One or more of the controllers (114, 124, 134, 144, 154, 164, and 190) can be used to exchange one or more Semiconductor Equipment Communications Standard (SECS) messages with the MES 180 or other systems (not shown), read and/or remove information, feed forward, and/or feedback the information, and/or send information as a SECS message. One or more of the formatted messages can be exchanged between controllers, and the controllers can process messages and extract new data in real-time. When new data is available, the new data can be used in real-time to update a model and/or procedure currently being used for the substrate and/or lot. For example, the current layout can be examined using the updated model and/or procedure when the model and/or procedure can be updated before the current layout is examined. The current layout can be examined using a non-updated model and/or procedure when an update cannot be performed before the current layout is processed. In addition, formatted messages can be used when resists are changed, when resist models are changed, when processing sequences are changed, when design rules are changed, or when layouts are changed.

In some examples, the MES 180 may be configured to monitor some subsystem and/or system processes in real-time, and factory level intervention and/or judgment rules can be used to determine which processes are monitored and which data can be used. For example, factory level intervention and/or judgment rules can be used to determine how to manage the data when a hot-spot and/or process defect is identified. The MES 180 can also provide modeling data, processing sequence data, and/or substrate data.

In addition, controllers (114, 124, 134, 144, 154, 164, and 190) can include memory (not shown) as required. For example, the memory (not shown) can be used for storing information and instructions to be executed by the controllers, and may be used for storing temporary variables or other intermediate information during the execution of instructions by the various computers/processors in the processing system 100. One or more of the controllers (114, 124, 134, 144, 154, 164, and 190), or other system components can comprise the means for reading data and/or instructions from a computer readable medium and can comprise the means for writing data and/or instructions to a computer readable medium.

The processing system 100 can perform a portion of or all of the processing steps of the invention in response to the computers/processors in the processing system executing one or more sequences of one or more instructions contained in a memory and/or received in a message. Such instructions may be received from another computer, a computer readable medium, or a network connection.

In some embodiments, an integrated system can be configured using system components from Tokyo Electron Limited (TEL). In other embodiments, external subsystems and/or tools may be included. One or more of the subsystems (110, 120, 130, 140, 150, 160, and 170) may include one or more etch elements, deposition elements, integrated-metrology (IM) elements, Atomic Layer Deposition (ALD) elements, measurement elements, ionizations elements, polishing elements, coating elements, developing elements, cleaning elements, exposure elements, and thermal treatment elements. In addition, measurement elements can be provided that can include a CD-Scanning Electron Microscopy (CDSEM) system, a Transmission Electron Microscopy (TEM) system, a focused ion beam (FIB) system, an Optical Digital Profilometry (ODP) system, an Atomic Force Microscope (AFM) system, or another optical metrology system. The subsystems and/or processing elements can have different interface requirements, and the controllers can be configured to satisfy these different interface requirements.

One or more of the subsystems (110, 120, 130, 140, 150, 160, and 170) can comprise control applications, Graphical User Interface (GUI) components, and/or database components. In addition, one or more of the subsystems (110, 120, 130, 140, 150, 160, and 170) and/or controllers (114, 124, 134, 144, 154, 164, and 190) can include Advanced Process Control (APC) applications, Fault Detection and Classification (FDC), and/or Run-to-Run (R2R) applications. In some embodiments, APC applications, FDC applications, and/or R2R applications can be performed.

Output data and/or messages from hot-spot-related procedures can be used in subsequent procedures to optimize the process accuracy and precision. Data can be passed to hot-spot-related procedures in real-time as real-time variable parameters, overriding current model default values and narrowing the search space for resolving accurate results. Real-time data can be used with a library-based system, or regression-based system, or any combination thereof to optimize a hot-spot-related procedure.

In some embodiments, the metrology subsystem 160 can include an integrated Optical Digital Profilometry (iODP) elements (not shown), and iODP elements/systems are available from Timbre Technologies Inc. (a TEL company). Alternatively, other metrology systems may be used. For example, iODP techniques can be used to obtain real-time data that can include critical dimension (CD) data, gate structure data, and thickness data, and the wavelength ranges for the iODP data can range from less than approximately 200 nm to greater than approximately 900 nm. Exemplary iODP elements can include ODP Profiler Library elements, Profiler Application Server (PAS) elements, and ODP Profiler Software elements. The ODP Profiler Library elements can comprise application specific database elements of optical spectra and its corresponding semiconductor profiles, CDs, and film thicknesses. The PAS elements can comprise at least one computer that connects with optical hardware and computer network. The PAS elements can be configured to provide the data communication, ODP library operation, measurement process, results generation, results analysis, and results output. The ODP Profiler Software elements can include the software installed on PAS elements to manage measurement recipe, ODP Profiler library elements, ODP Profiler data, ODP Profiler search/match results, ODP Profiler calculation/analysis results, data communication, and PAS interface to various metrology elements and computer network.

The metrology subsystem 160 can use polarizing reflectometry, spectroscopic ellipsometry, reflectometry, or other optical measurement techniques to measure accurate device profiles, accurate CDs, and multiple layer film thickness of a substrate. The integrated metrology process (iODP) can be executed as an integrated process in an integrated group of subsystems. In addition, the integrated process eliminates the need to break the substrate for performing the analyses or waiting for long periods for data from external systems. iODP techniques can be used with the existing thin film metrology systems for inline profile and CD measurement, and can be integrated with TEL processing systems and/or lithography systems to provide real-time process monitoring and control.

Simulated metrology data can be generated by applying Maxwell's equations and using a numerical analysis technique to solve Maxwell's equations.

When a regression-based library creation procedure is used, a measured hot-spot data can be compared to simulated hot-spot data. The simulated hot-spot-related data can be iteratively generated, based on sets of process-related parameters, to obtain a convergence value for the set of process-related parameters that generates the closest match simulated hot-spot data compared to the measured hot-spot data.

When a library-based process is used, a hot-spot data library can be generated and/or enhanced using hot-spot-related procedures, recipes, profiles, and/or models. For example, a hot-spot data library can comprise simulated and/or measured hot-spot data and corresponding set of process-related parameters. The regression-based and/or the library-based process can include hot-spot-related procedures.

An alternative procedure for generating a hot-spot library can include using a machine learning system (MLS). For example, prior to generating the hot-spot library data, the MLS can be trained using known input and output data, and the MLS may be trained with a subset of the hot-spot library data.

One or more of the controllers (114, 124, 134, 144, 154, 164, and 190) can perform APC, R2R, FDC, and/or hot-spot-related procedures that can be context dependent and can include control strategies, analysis strategies, modeling strategies, and/or simulation managers to provide real-time processing. Strategies can cover multiple process steps within a substrate processing sequence, and can be executed when a context is matched. For example, hot-spot-related procedures can reject the data at one or more of the sites for a substrate when a procedure fails. Intervention, business, and/or judgment rules can be defined in a strategy, plan, model, subsystem, element, or procedure and can be assigned to execute whenever a matching context is encountered. The intervention and/or judgment rules can be established for various hot-spot-related procedures and can be maintained in the database.

Unsuccessful procedures or processing sequences can report a failure when a limit is exceeded, and successful procedures can create warning messages when limits are being approached. Pre-specified failure actions for procedures errors can be stored in a database, and can be retrieved from the database when an error occurs.

Figure 2:
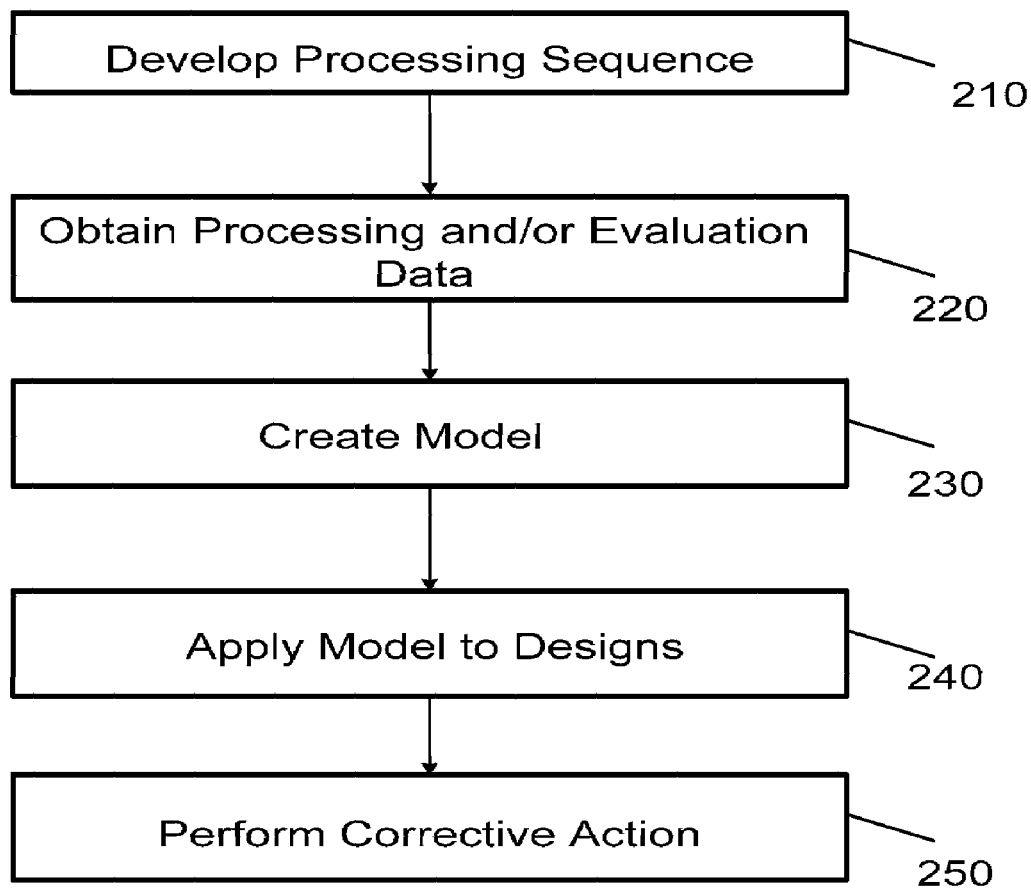
FIG. 2 shows an exemplary flow diagram of a procedure for creating a model in accordance with embodiments of the invention.

FIG. 2 shows an exemplary flow diagram of a procedure for creating a model in accordance with embodiments of the invention. In the illustrated embodiment, a procedure 200 is shown for creating a hot-spot-related model. Alternatively, other models may be created, and other procedures having different steps may be used. For example, one or more of the controllers (114, 124, 134, 144, 154, 164, and 190) can be configured for selecting one or more processing sequences using historical data and/or the real-time data, for determining the number of substrates to be processed during the selected processing sequence, for obtaining substrate data for each substrate, for creating one or more hot-spot-related models, for applying one or more of the hot-spot-related models to one or more designs, for identifying one or more hot-spot patterns and/or structures, for establishing the number of substrates to be analyzed, for determining operational state data for the one or more subsystems (110, 120, 130, 140, 150, 160, and 170), for determining a processing state for one or more of the substrates, for determining hot-spot probability data for the one or more subsystems (110, 120, 130, 140, 150, 160, and 170), for determining hot-spot probability data for one or more of the procedures in the selected processing sequence, and for updating models and/or design data.

In 210, one or more processing sequences can be developed. The processing sequences can include one or more mask creation procedures, one or more deposition procedures, one or more coating procedures, one or more etching procedures, one or more thermal procedures, one or more implanting procedures, one or more doping procedures, one or more exposure procedures, one or more oxidation procedures, one or more nitridation procedures, one or more ionization procedures, one or more development procedures, one or more lithography-related procedures, one or more scanner-related procedures, one or more measurement procedures, one or more inspection procedures, one or more evaluation procedures, one or more simulation procedures, one or more prediction procedures, one or more rework procedures, one or more storage procedures, one or more transfer procedures, one or more modeling procedures, or one or more cleaning procedures, or any combination thereof.

The processing system 100 can be used to perform and/or verify one or more of the procedures in the selected processing sequence. In some embodiments, one or more substrates can be received by one or more transfer subsystems 170, and the transfer subsystems 170 can transfer one or more of the substrates to one or more of the subsystems (110, 120, 130, 140, and 150) in the processing system 100. One or more of the subsystems (110, 120, 130, 140, 150, 160, and 170) can be used one or more times during the processing sequence, and each subsystem can process one or more substrates in parallel. In addition, the one or more processing elements (113, 123, 133, 143, 153, and 163) can be used one or more times during the processing sequence, and each processing element can process one or more substrates in parallel.

In 220, processing data and/or evaluation data can be obtained during the selected processing sequence. For example, Design of Experiments (DOE) techniques can be used to obtain hot-spot data and/or photoresist modeling data.

One or more of the evaluation elements (115, 125, 135, 145, 155, and 165) can provide processing data and/or evaluation data for one or more substrates. One or more of the evaluation elements (115, 125, 135, 145, 155, and 165) can be used to determine resist data, thermal data, resist and/or substrate thickness data, resist and/or substrate uniformity data, curvature data, developing data, pattern data, or error data, any combination thereof. One or more of the evaluation elements (115, 125, 135, 145, 155, and 165) can perform evaluation procedures to determine if the circuit design is correct or if a design rule change is required. For example, one or more of the evaluation procedures can provide hot-spot data that can include contrast data for damaged patterns, features, and/ or structures for different sites, substrates, and/or lots.

In other examples, processing data and/or evaluation data can be obtained from the metrology subsystem 160, and the metrology data can also include measured and/or simulated data associated with hot-spot-related patterns or structures, and the data can be stored using yield, risk, confidence, processing, substrate, lot, recipe, field, site, pattern, image, or substrate location data. Metrology data can include variables associated with hot-spot images and/or patterns, verified hot-spot images and/or patterns, layout rules, metrology device types and processing subsystems. The metrology data may include fixed and/or variable profile parameters (such as CD, sidewall angle, refractive index (n) data and extinction coefficient (k) data), and/or metrology device parameters (such as wavelengths, angle of incidence, and/or azimuth angle).

In still other examples, processing data and/or evaluation data can be obtained from the inspection subsystem 150, and the inspection data can include measured, calculated, and/or simulated images and/or contrast data associated with hot-spot-related patterns or structures, and the inspection data can be stored using yield, risk, confidence, processing, substrate, lot, recipe, field, site, pattern, image, or substrate location data. Inspection data can include variables associated with hot-spot patterns and/or structures, targets, error data, inspection device type and associated variables, and ranges used for the variables floated in the modeling and values of variables that were fixed in the modeling.

In 230, one or more models can be created. In some embodiments, simulation models can be created that quantify one or more of the relationships between lithography contrast data and hot-spot (defect) generation. These lithography simulation models can be calibrated from a specific set of processes and can be used to optimize IC design layouts and mask creation rules that can be used to produce the highest yield.

In various examples, multi-input multi-output (MIMO) models can be established and/or used to predict hot-spot and/or process defect data for one or more patterned layers. Some MIMO models can be established and/or used to predict hot-spot and/or process defect data for one or more masking layers using layout and/or measurement data for one or more previously created layers.

Hot-spot data, and/or contrast data can be different near isolated and/or nested structures, and hot-spot data can also be different near open areas, via array areas, and/or trench array areas. The processing subsystem 100 can create and use different hot-spot models for isolated and/or nested structures when verifying and/or optimizing design layouts and/or design rules. In addition, the processing subsystem 100 can create and use different hot-spot models for open areas, via array areas, and/or trench array areas when verifying and/or optimizing design layouts and/or design rules.

When yield modeling is performed, a modified Poisson model can be used or a modified Negative Binomial model can be used. Alternatively, other yield models can be used.

When resist modeling, a modified three-dimensional Lumped Parameter Model (LPM) can be used. The modified LPM model can include a dissolution in the resist as a function of Image Intensity (I) component that can be dependent on exposure energy (E) and the dissolution contrast parameters (gamma ($\gamma$), $R_0$ and $R_{min}$). In addition, the dissolution in the resist component can include an acid diffusion term that is based on a soluble species (S).

In 240, one or more models can be applied to a layout. In some embodiments, a first image parameter (IP) based model can be calculated as shown below:

$$IP_1 = \left.\left|\frac{\partial M}{\partial x}\right| \times \frac{\partial R}{\partial M}\right|_{(z,y)}$$

where M is the PAC concentration, R is the dissolution rate, and x is the position. When image parameters are used, the resist modeling parameters (kinetics/dissolution) can be obtained using DOE techniques. The IP based model is a more accurate model and can include resist-related chemistry parameters, resist-related photokinetic parameters, and resist-related dissolution parameters. The IP model can be calibrated and/or updated using real-time procedures.

In some examples, the IP based model (shown above) can be used to analyze the separation distances "space segments" across the complete layout. In other examples, the IP based model can be used to analyze the separation distances "space segments" across a portion of the layout. Probability of bridging is assigned to each design segment=(# measured bridges/area)*(area/# of design segments) as a function of simulated IP parameter for each segment.

Figure 3A:
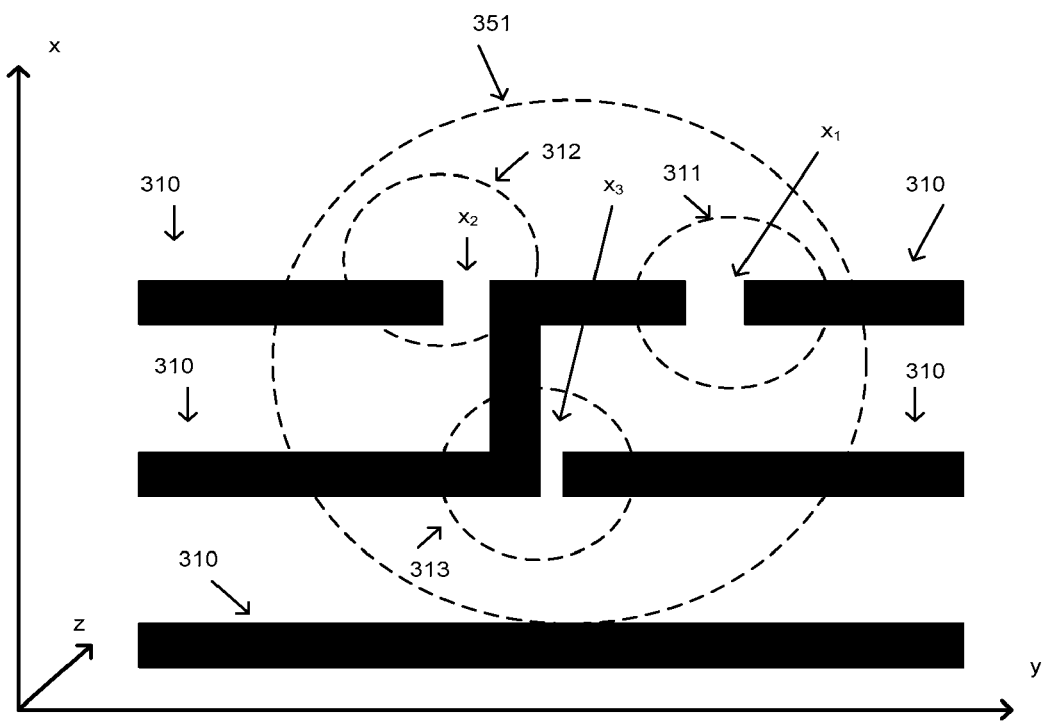
FIGS. 3a and 3b illustrate exemplary circuit layout is accordance with embodiments of the invention.

FIG. 3a illustrates a first portion of an exemplary layout in accordance with embodiments of the invention. In FIG. 3a, a number of exemplary line features 310 are shown along with three exemplary evaluation fields (311, 312, and 313), each having a simplified end-of-line condition. The first exemplary evaluation field 311 and associated simplified end-of-line condition can be characterized using a first separation distance $x_1$, and this simplified end-of-line condition can illustrate a "non-hot-spot" condition on the layout. The second exemplary evaluation field 312 and associated simplified end-of-line condition can be characterized using a second separation distance $x_2$, and this simplified end-of-line condition can illustrate a "hot-spot threshold" condition on the layout. The third exemplary evaluation field 313 and associated simplified end-of-line condition can be characterized using a third separation distance $x_3$, and this simplified end-of-line condition can illustrate a "hot-spot" condition on the layout. Alternatively, other layout shapes and other hot-spot points may be illustrated.

Figure 3B:
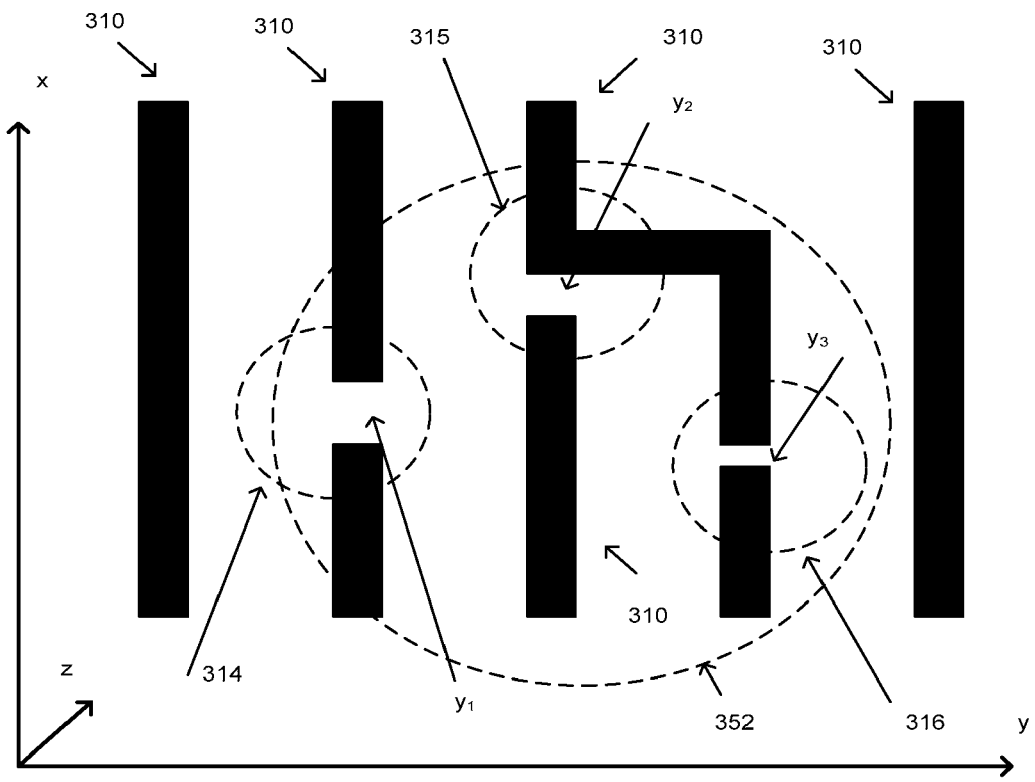

FIG. 3b illustrates a second portion of an exemplary layout in accordance with embodiments of the invention. In FIG. 3b, an additional number of exemplary line features 310 are shown along with three exemplary evaluation fields (314, 315, and 316), each having a simplified end-of-line condition. The fourth exemplary evaluation field 314 and associated simplified end-of-line condition can be characterized using a first separation distance $y_1$, and this simplified end-of-line condition can illustrate a "non-hot-spot" condition on the layout. The fifth exemplary evaluation field 315 and associated simplified end-of-line condition can be characterized using a fifth separation distance $y_2$, and this simplified end-of-line condition can illustrate a "hot-spot threshold" condition on the layout. The sixth exemplary evaluation field 316 and associated simplified end-of-line condition can be characterized using a sixth separation distance $y_3$, and this simplified end-of-line condition can illustrate a "hot-spot" condition on the layout. Alternatively, other layout shapes and other hot-spot points may be illustrated.

Referring back to FIG. 3a, a first set of first IP based model values can be calculated for a plurality of first evaluation fields 311 across the substrate using one or more first separation distances ($x_1$). The first set of first IP based model values can be compared to one or more first IP threshold values. In some cases, the one or more first IP threshold values can be substantially the same across the entire substrate, and in other cases, the one or more first IP threshold values can be different at different points on the substrate. When one of the first set of first IP based model values is greater than a first IP threshold value, as shown in the first evaluation field 311, that layout segment can be identified as a "non-hot-spot" segment.

In addition, a second set of first IP based model values can be calculated for a plurality of second evaluation fields 312 across the substrate using one or more second separation distance ($x_2$). The second set of first IP based model values can be compared to one or more second IP threshold values. In some cases, the one or more second IP threshold values can be substantially the same across the entire substrate, and in other cases, the one or more second IP threshold values can be different at different points on the substrate. When one of the second set of first IP based model values is approximately equal to one of the second IP threshold values, as shown in the second evaluation field 312, that layout segment can be identified as "threshold-hot-spot" segments. In some circuit designs, one or more "threshold-hot-spot" segments may be allowed in a first larger evaluation field 351.

Still referring to FIG. 3a, a third set of first IP based model values can be calculated for a plurality of third evaluation fields 313 across the substrate using one or more third separation distances ($x_3$). The third set of first IP based model values can be compared to one or more third IP threshold values. In some cases, the one or more third IP threshold values can be substantially the same across the entire substrate, and in other cases, the one or more third IP threshold values can be different at different points on the substrate. When one of the third set of first IP based model values is less than a third IP threshold value, as shown in the third evaluation field 313, that layout segment can be identified as a "hot-spot" segment. In some circuit designs, one or more "hot-spot" segments may not be allowed in a first larger evaluation field 351.

In other embodiments, a second image parameter (IP) based model can be calculated as shown below:

$$IP_2 = \left.\frac{\partial M}{\partial y}\right| \times \left.\frac{\partial R}{\partial M}\right|_{(z,x)}$$

where M is the PAC concentration, R is the dissolution rate, and y is the position. When image parameters are used, the resist modeling parameters (kinetics/dissolution) can be obtained using DOE techniques. The IP based model is a more accurate model and can include resist-related chemistry parameters, resist-related photokinetic parameters, and resist-related dissolution parameters. The IP model can be calibrated and/or updated using real-time procedures.

In some examples, the second IP based model (shown above) can be used to analyze the separation distances "space segments" across the complete layout. In other examples, the second IP based model can be used to analyze the separation distances "space segments" across a portion of the layout.

Referring back to FIG. 3b, a first set of second IP based model values can be calculated for a plurality of fourth evaluation fields 314 across the substrate using one or more fourth separation distances ($y_1$). The first set of second IP based model values can be compared to one or more fourth IP threshold values. In some cases, the one or more fourth IP threshold values can be substantially the same across the entire substrate, and in other cases, the one or more fourth IP threshold values can be different at different points on the substrate. When one of the first set of second IP based model values is greater than a fourth IP threshold value, as shown in the fourth evaluation field 314, that layout segment can be identified as a "non-hot-spot" segment.

In addition, a second set of second IP based model values can be calculated for a plurality of fifth evaluation fields 315 across the substrate using one or more fifth separation distance ($y_2$). The second set of second IP based model values can be compared to one or more fifth IP threshold values. In some cases, the one or more fifth IP threshold values can be substantially the same across the entire substrate, and in other cases, the one or more fifth IP threshold values can be different at different points on the substrate. When one of the second set of second IP based model values is approximately equal to one of the fifth IP threshold values, as shown in the fifth evaluation field 315, that layout segment can be identified as "threshold-hot-spot" segments. In some circuit designs, one or more "threshold-hot-spot" segments may be allowed in a second larger evaluation field 352.

Still referring to FIG. 3b, a third set of second IP based model values can be calculated for a plurality of sixth evaluation fields 316 across the substrate using one or more sixth separation distances ($y_3$). The third set of second IP based model values can be compared to one or more sixth IP threshold values. In some cases, the one or more sixth IP threshold values can be substantially the same across the entire substrate, and in other cases, the one or more sixth IP threshold values can be different at different points on the substrate. When one of the third set of second IP based model values is less than a sixth IP threshold value, as shown in the sixth evaluation field 316, that layout segment can be identified as a "hot-spot" segment. In some circuit designs, one or more "hot-spot" segments may not be allowed in a larger evaluation field 315.

In 250, one or more corrective actions and/or updates can be performed. When one or more "threshold-hot-spot" segments and/or "hot-spot" segments are identified, corrective actions can be performed. The corrective actions can include changing the design by making the physical geometry bigger, changing the processing sequence, changing the resist or resist parameters, changing the threshold to provide more latitude, or changing the imaging strategy (ex double pattern). Once the design passes the hot spot detection criteria, the circuit design can be identified as a manufacturable design and can proceed with reticle building and silicon testing.

In some design environments, the probability of bridging can be determined using the calculated IP values, and bridging-related data can be stored in a hot-spot library.

In other embodiments, stochastic model parameters can be used to determine hot spot and/or scumming probability using the percent (%) of polymer de-protection that occurs across a physical space (output).

In still other embodiments, the hot spot and/or scumming probability can be modeled using a Monte Carlo approach that uses process error distributions for exposure dose, focus, resist chemistry, resist bake conditions, water contact time, immersion spot size, etc.

One or more processing subsystems can use the hot-spot data to update, and/or optimize processing sequence data, hot-spot pattern data, and/or modeling data. For example, the etching subsystem 130 can use hot-spot data to update and/or optimize an etching chemistry model and/or etching time. Hot-spot-related procedures can use end-point detection (EPD) data and process time data as process-related parameters to improve the accuracy. When EPD data is used, the EPD time data and the process rate data can be used to determine and/or refine the hot-spot procedure, model and/or data.

Figure 4A:
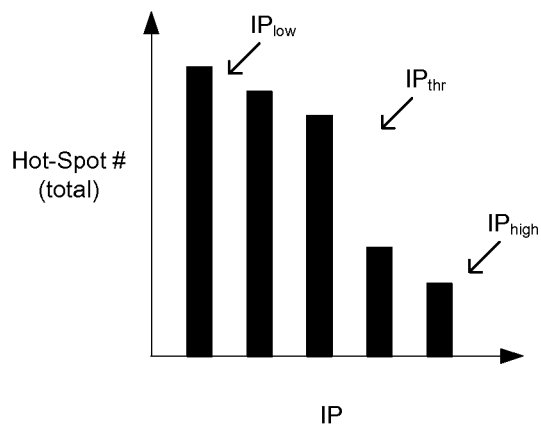
FIGS. 4a-4d show exemplary data in accordance with embodiments of the invention.
Figure 4B:
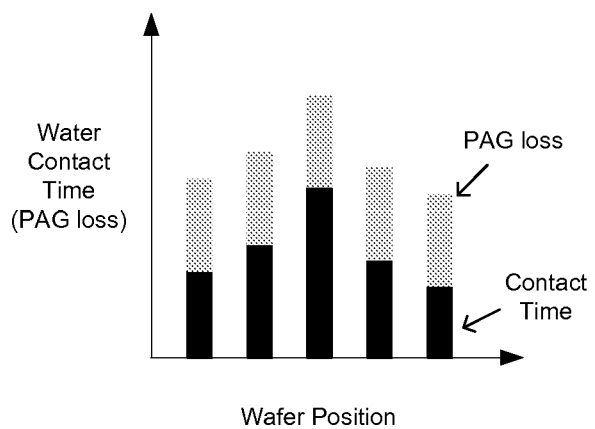
Figure 4C:
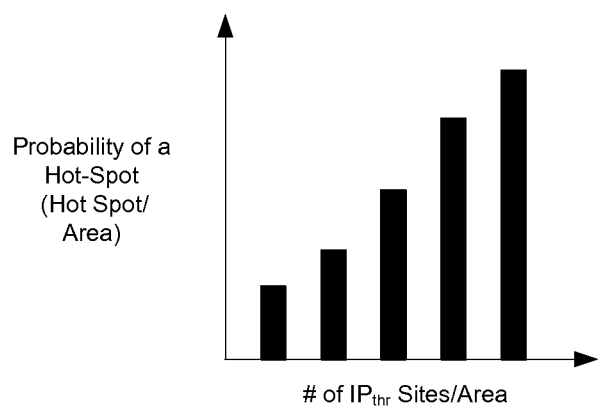

FIGS. 4a-4d show exemplary data in accordance with embodiments of the invention. For example, FIGS. 4a-4c show how the hot-spot calibrated lithography simulation of the invention captures the stochastic or statistical effects that occur from multiple variation sources in the lithography-related (track) or scanner-related (imaging) process.

In FIG. 4a, a first set of calibration data is shown that illustrates a relationship between the hot-spot data and Image Parameter (IP) data. In the illustrated graph, the hot-spot data is shown as the total number of hot-spots and the IP data is shown as low IP values, threshold IP values, and maximum IP values. In FIG. 4b, a second set of calibration data is shown that illustrates a relationship between two substrate variables and the substrate (wafer) position. The two substrate variables are the water contact time and Photo Acid Generator (PAG) loss. Alternatively, other variables may be used. In FIG. 4c, a third set of calibration data is shown that illustrates a relationship between the probability of a hot-spot and some IP data. In the illustrated graph, the number of hot-spots in a first area is shown versus the total number of threshold IP value points in the first area.

Figure 4D:
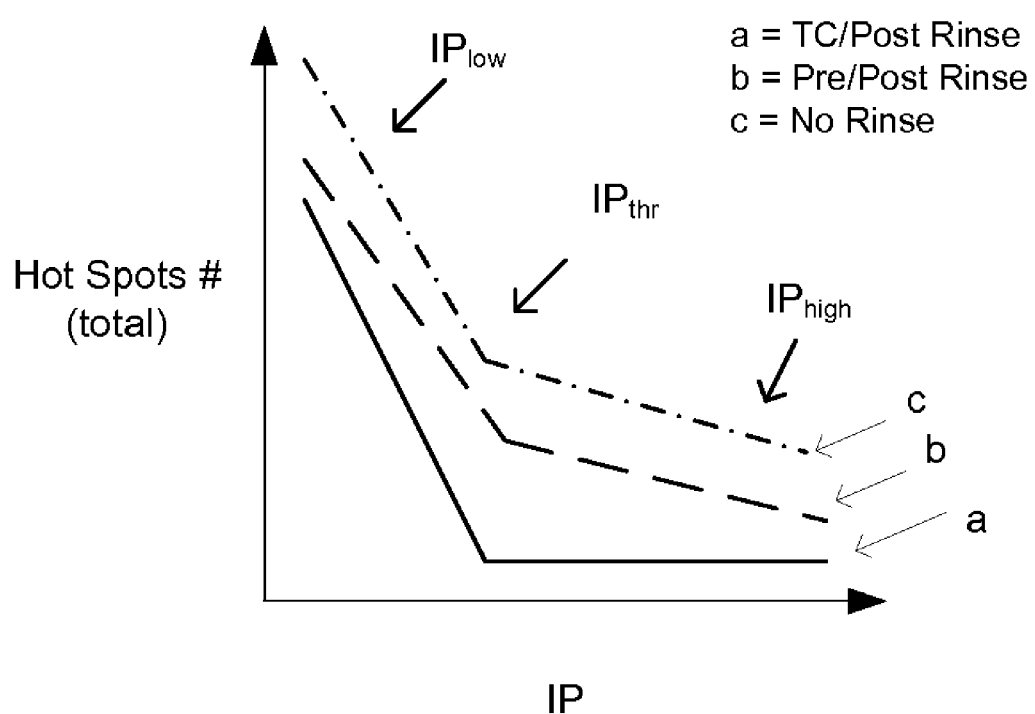

FIG. 4d shows additional exemplary data in accordance with embodiments of the invention. In the illustrated graph, the hot-spot data is shown as the total number of hot-spots on the y-axis and the IP data is shown on the x-axis. In the graph, a low IP value area is shown, a threshold IP value area is shown, and a maximum IP value area is shown. In addition, three sets of exemplary data are shown for three different processing sequences. First data values are illustrated by graph "a" for a first processing sequence that include a TC procedure and a post rinse procedure. Second data values are illustrated by graph "b" for a second processing sequence that include a pre-rinse procedure and a post rinse procedure. Third data values are illustrated by graph "c" for a third processing sequence that does not include a rinse procedure.

Figure 5:
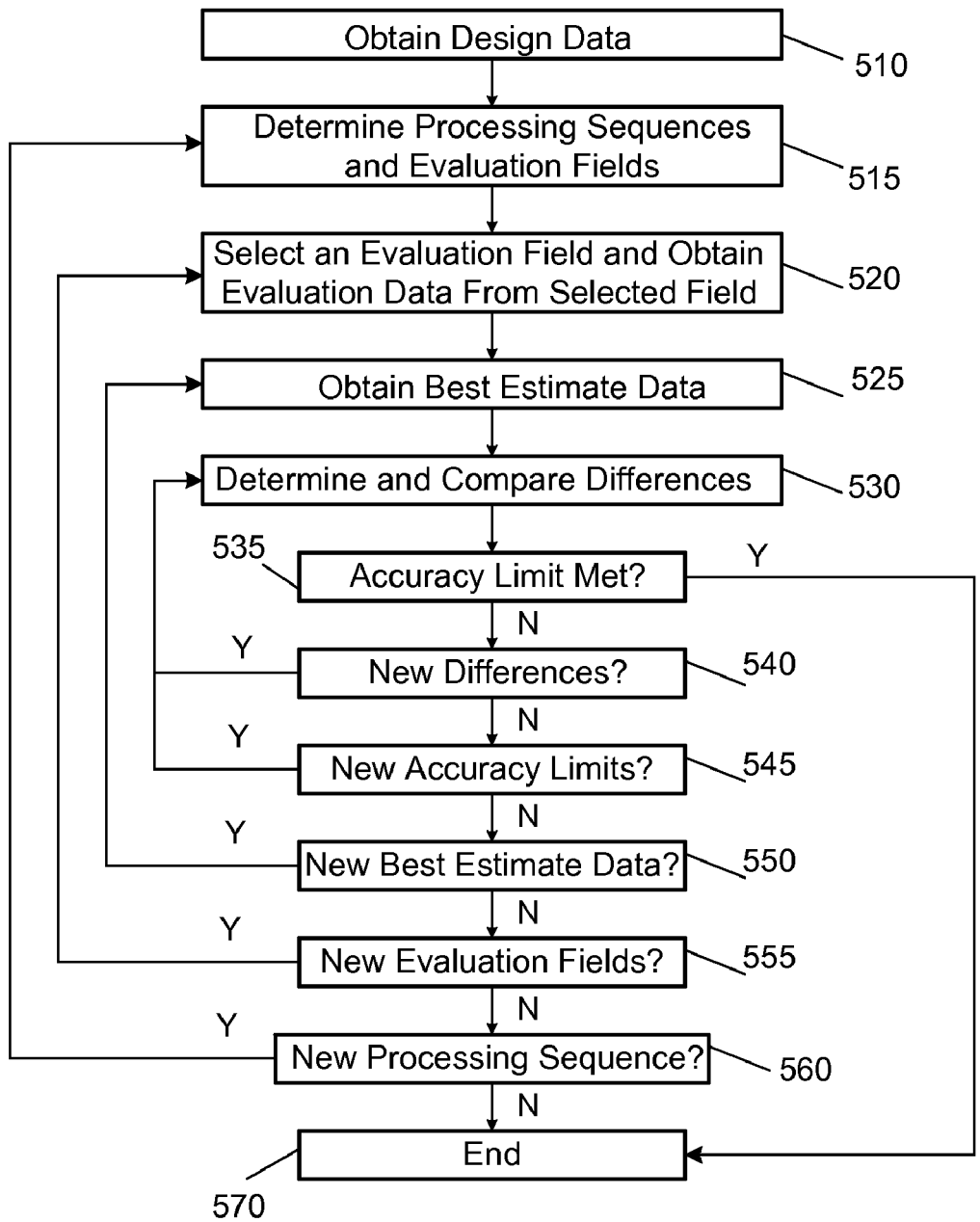
FIG. 5 shows an exemplary flow diagram of a procedure for processing substrates in accordance with embodiments of the invention.

FIG. 5 illustrates an exemplary procedure for processing a substrate using a hot-spot library in accordance with embodiments of the invention. In the illustrated embodiment, a procedure 500 is shown for evaluating a circuit layout using a hot-spot library.

In 510, first layout data can be obtained. The first layout data can include a test layout that was established for a first layer of a substrate and was created by a first layout tool using a first set of design rules.

In 515, one or more test processing sequences can be selected to be used with the test layout, and a number of evaluation fields can be identified (determined) for the test layout using first risk data associated with the test processing sequence, second risk data associated with the first set of design rules, or third risk data associated with one or more models, or any combination thereof. Each evaluation field in the test layout can include one or more line segments that were created using the first set of design rules. In addition, the test processing sequence and the first set of design rules can have yield data associated with them, and the test processing sequence can be performed with simulated processing tools and simulated processing parameters, or with real processing tools and real processing parameters, or any combination thereof.

In 520, an evaluation field can be selected and evaluation data can be obtained from the selected evaluation field in the test layout using optical measuring techniques, and the first evaluation data can include a first measured contrast image, a first calculated IP value, or first NILS value, or any combination thereof.

In 525, best estimate data can be obtained in real-time from the hot-spot library, and the best estimate data can include a best estimate contrast image, a best estimate IP value, or a best estimate NILS value, or any combination thereof.

In 530, one or more differences can be determined using the evaluation data and the best estimate data, and one or more of the differences can be compared to one or more accuracy limits.

In 535, a query can be performed to determine if one or more of the accuracy limits are met. Procedure 500 can branch to 570 when one or more of the accuracy limits are met, and procedure 500 can branch to 540 when one or more of the accuracy limits are not met.

In 540, a query can be performed to determine when a new difference can be used to evaluate the test layout. Procedure 500 can branch to 530 when new difference data can be calculated for evaluating the test layout, and procedure 500 can branch to 550 when new difference data cannot be calculated. In a first example, differences can be determined between the measured contrast image and the best estimate contrast image, in a second example, differences can be determined between the calculated IP value, and the best estimate IP value, and in a third example, differences can be determined between the NILS value and the best estimate NILS value.

In 545, a query can be performed to determine when new accuracy limits can be used to evaluate the test layout. Procedure 500 can branch to 530 when new accuracy limits can be used for evaluating the test layout, and procedure 500 can branch to 550 when new accuracy limits cannot be used. For example, different accuracy limits can be established for different portions of the test layout.

In 550, a query can be performed to determine when additional best estimate data can be obtained form the hot-spot library that can be used to evaluate the test layout. Procedure 500 can branch to 525 when additional best estimate data can be obtained for evaluating the test layout, and procedure 500 can branch to 555 when additional best estimate data are not available. For example, different best estimate data can be obtained from different portions of the hot-spot library.

In 555, a query can be performed to determine when additional evaluation fields can be used to evaluate the test layout. Procedure 500 can branch to 520 when additional evaluation fields are available for evaluating the test layout, and procedure 500 can branch to 560 when additional evaluation fields are not available. For example, different evaluation fields can be established for different portions of the test layout.

In 560, a query can be performed to determine when a new test processing sequence can be used to evaluate the test layout. Procedure 500 can branch to 515 when a new test processing sequence is available for evaluating the test layout, and procedure 500 can branch to 580 when a new test processing sequence is not available. For example, a new test processing sequence can be established to obtain additional risk data, confidence data, yield data, or other hot-spot-related data to associate with the test layout.

In 570, procedure 500 can end.

When creating and/or verifying hot-spot library data, hot-spot-related procedures can use measured, predicted, and/or simulated data, and these procedures may utilize context information such as pattern ID, field ID, site ID, substrate ID, slot ID, lot ID, recipe, state, and hot-spot structure ID as a means for organizing and indexing data. In some examples, the library data can include verified data associated with products, devices, substrates, procedures, lots, recipes, sites, locations, patterned and/or un-patterned structures.

In some embodiments, hot-spot probability data can be chamber dependent and chamber-related (matching) data and/or procedures can be used when creating and/or verifying hot-spot-related data. When procedures are performed, chamber-related (matching) data can be obtained from one or more of the processing elements (113, 123, 133, 143, 153, and 163) and/or from one or more of the evaluation elements (115, 125, 135, 145, 155, and 165). Chamber-related (matching) data can be used to determine design rule problems, processing sequences, confidence data, and risk data during one or more procedures. For example, when a hot-spot image and/or pattern is expected on a first substrate, real-time probability data can be determined for the first substrate and the associated chambers, and when the hot-spot image and/or pattern is expected on a second substrate, real-time probability data can be determined for the second substrate and associated chambers, and chamber-related yield data can be determined using the real-time probability data. In addition, hot-spot evaluation and/or verification procedures can be performed using one or more "golden substrates" that can be stored and used periodically to verify the performance of one or more of the chambers. Furthermore, one or more reference chips associated with a measurement, evaluation, and/or inspection chamber may be used.

For example, real-time chamber-related (matching) data can include hot-spot image and/or pattern data, alignment data, overlay data, material data, critical dimension (CD) data, sidewall angle (SWA) data, structure data, or thickness data, or any combination thereof. In addition, data in a hot-spot data library can be updated and/or refined using the first real-time chamber-matching data when library creation rules are not violated.

In some cases, Design of Experiments (DOE) techniques can be used to obtain hot-spot data and/or photoresist data. In addition, there can be a number of verified hot-spot-creation and unverified hot-spot-creation procedures, and real-time and historical data can be associated with these procedures. When hot-spot-creation procedures are performed, location-based techniques can be used, and one or more of the controllers (114, 124, 134, 144, 154, 164, and 190) can be used to determine if the procedure is a verified hot-spot-creation procedure. Verification decisions for a hot-spot-creation procedure can be made using the data from a first location, and the first location can be selected from the number of evaluation and/or verification locations on the first substrate. The first location can have a first hot-spot pattern associated therewith that was created during the hot-spot-creation procedure. Evaluation and/or verification data can be obtained from the first location. For example, measurement, process, and/or inspection data can be obtained from one or more of the subsystems (110, 120, 130, 140, 150, 160, and 170). For example, a verified hot-spot pattern can be associated with the first site on the first substrate and that hot-spot pattern can be associated with a verified hot-spot-creation procedure, and the historical/verification data can include verified imaging data, verified modeling data, verified contrast data, and/or verified IP data that can be obtained from a hot-spot and/or defect data library and/or database. Confidence data and/or risk data can be established for the hot-spot-creation procedure using calculated data. The hot-spot-creation procedure can be identified as a verified hot-spot-creation procedure when a first verification limit is met, and the hot-spot-creation procedure can be identified as an un-verified hot-spot-creation procedure when a first verification limit is not met. In addition, when a hot-spot-creation procedure is being verified, additional sites and/or additional substrates can be used.

In addition, hot-spot-creation and/or hot-spot-verification procedures can be performed in real-time and can include one or more lithography-related procedures, one or more scanner-related procedures, one or more inspection-related procedures, one or more measurement-related procedures, one or more evaluation-related procedures, one or more etch-related procedures, one or more trimming-related procedures, one or more deposition-related procedures, one or more thermal processing procedures, one or more coating-related procedures, one or more alignment-related procedures, one or more polishing-related procedures, one or more storage-related procedures, one or more transfer procedures, one or more cleaning-related procedures, one or more rework-related procedures, one or more oxidation-related procedures, one or more nitridation-related procedures, or one or more external procedures, or any combination thereof.

In some embodiments, the data used to create, evaluate, and/or verify hot-spot images and/or patterns can include resist data, contrast data, reflected data, intensity data, transmission data, absorption data, reflectance data, diffraction data, optical properties data, or image data, or any combination thereof. The verification data can include historical data, real-time data, optical metrology data, imaging data, particle data, CD-scanning electron microscope (CD-SEM) data, transmission electron microscope (TEM) data, and/or focused ion beam (FIB) data. The threshold limit data can include goodness of fit data, CD data, accuracy data, wavelength data, sidewall data, particle data, process data, historical data, or a combination thereof.

Substrate 105 can be, for example, a semiconductor substrate, a work piece, or a liquid crystal display (LCD), and the substrates 105 can include one or more layers that can include semiconductor material, carbon material, dielectric material, glass material, ceramic material, metallic material, oxidized material, mask material, or planarization material, or a combination thereof. When a product is being developed, one or more hot-spot and/or defect data libraries can be created, refined, updated, and/or used, and the hot-spot and/or defect data libraries can include patterns, features, properties, structures, procedures, images, and/or optical data.

When hot-spot and/or defect data are created and/or verified, accuracy and/or tolerance limits can be used. When the limits are not met, refinement procedures can be performed. Alternatively, other procedures can be performed, other sites can be used, or other substrates can be used. When a refinement procedure is used, the refinement procedure can utilize bilinear refinement, Lagrange refinement, Cubic Spline refinement, Aitken refinement, weighted average refinement, multi-quadratic refinement, bi-cubic refinement, Turran refinement, wavelet refinement, Bessel's refinement, Everett refinement, finite-difference refinement, Gauss refinement, Hermite refinement, Newton's divided difference refinement, osculating refinement, or Thiele's refinement algorithm, or a combination thereof.

Corrective actions may be used when limits are not met, and the corrective actions can include stopping the processing, pausing the processing, re-evaluating one or more of the substrates, re-measuring one or more of the substrates, re-inspecting one or more of the substrates, re-working one or more of the substrates, storing one or more of the substrates, cleaning one or more of the substrates, delaying one or more of the substrates, or stripping one or more of the substrates, or any combination thereof.

In addition, the hot-spot data can include gate data, drain data, source data, capacitor data, via data, trench data, two-dimensional memory structure data, three-dimensional memory structure data, SWA data, bottom CD data, top CD data, middle CD data, polygon data, array data, periodic structure data, alignment feature data, doping data, strain data, damaged-structure data, or reference structure data, or any combination thereof.

When a first (most accurate) creation threshold limit is met, the hot-spot and/or defect data being examined can be identified as having the highest level of confidence and/or the lowest risk factor associated therewith. When another (less accurate) creation threshold limit is met, the hot-spot and/or defect data being examined can be identified as having a lower level of confidence and/or a higher risk factor associated therewith. When one or more creation threshold limits are not met, the hot-spot and/or defect data being examined can be identified as unverified hot-spot and/or defect data having a low level of confidence and/or a high risk factor associated therewith.

The evaluation sites can include pattern-dependent sites, resist-dependent sites, alignment-dependent sites, overlay-dependent sites, process-dependent sites, measurement-dependent sites, inspection-dependent sites, gate-dependent sites, substrate-dependent sites, or product-dependent sites, or any combination thereof. The limit data can include confidence limits, risk limits, yield limits, process-dependent limits, resist-dependent limits, hot-spot-dependent limits, error-dependent limits, gate structure limits, accuracy limits, time limits, product requirement limits, measurement limits, inspection limits, simulation limits, prediction limits, or historical limits, or any combination thereof. For example, individual and/or total confidence values for the circuit design can be compared to individual and/or total confidence limits. The circuit design can be used, if one or more of the confidence limits are met, or corrective actions can be applied if one or more of the confidence limits are not met.

Figure 6:
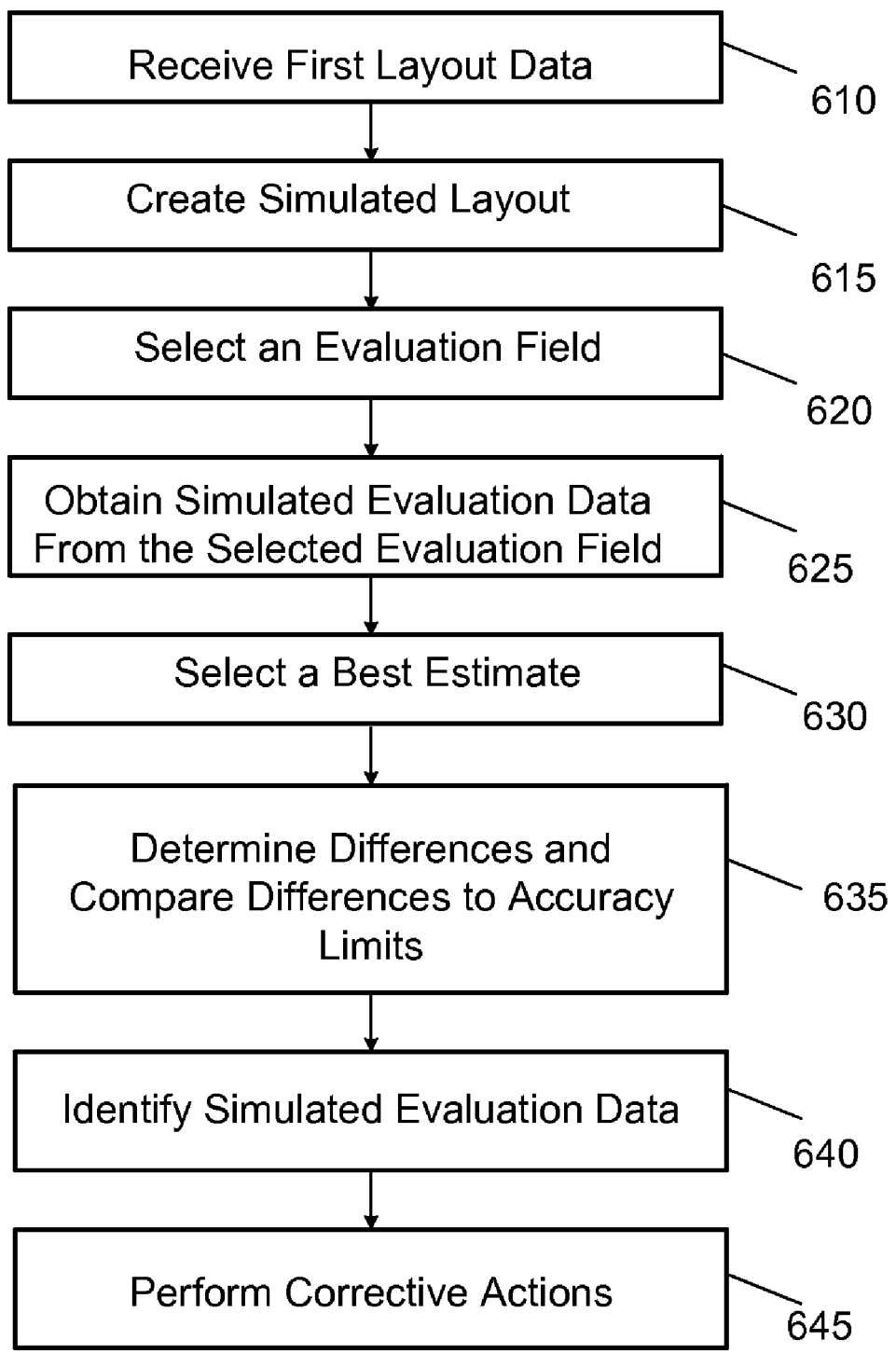
FIG. 6 shows an exemplary flow diagram of another procedure for processing substrates in accordance with embodiments of the invention.

FIG. 6 illustrates a method of processing a substrate in accordance with embodiments of the invention. In the illustrated embodiment, a procedure 600 is shown for creating hot-spot library data. Alternatively, other procedures having different steps may be used.

In 610, a first layout can be obtained for a first layer of the substrate, and the first layout can be a test layout that was created by a layout tool using a first set of design rules. The first layout can be examined using a hot-spot library, and the hot-spot library can include hot-spot patterns and/or structures. For example, the first layout and a first simulated processing sequence can be used to create a first simulated layout on a substrate, and the first simulated layout can include one or more simulated patterns in one or more layers on the substrate.

In 615, one or more simulated layouts can be calculated for a substrate using the first layout and one or more simulated processing sequences. The simulated processing sequences can include simulated and non-simulated procedures, and the substrate can be a simulated or an actual substrate. In various examples, the first layout and one or more simulated processing sequences can be used to create a first simulated pattern in a reticle/mask, in an exposed masking layer, in a developed masking layer on a substrate, or in an etched masking layer on a substrate, or in an etched substrate layer, or in a deposited layer on a substrate, or in an implanted layer on a substrate, or a doped layer, or a cleaned layer, or a polished layer, or any combination of layers on a substrate.

In 620, one or more simulated evaluation fields can be identified in the one or more of the simulated layout and/or in the first test layout using data associated with the simulated processing sequence or data associated with the first set of design rules, or any combination thereof. For example, a simulated evaluation field can include one or more simulated hot-spot patterns and/or structures that were created using the simulated processing sequence. In addition, the first set of design rules and/or the simulated processing sequences can have yield data associated therewith, and yield data limit can be determined using real-time and/or historical data. In some cases, one or more reference (golden) processing sequences can be performed using a first set of (golden) processing tools and/or golden processing parameters.

In 625, simulated evaluation data can be obtained for one or more of the simulated evaluations fields. For example, simulated hot-spot pattern and/or structure data can be obtained for one or more of the simulated evaluation fields using one or more hot-spot models. In addition, simulated contrast data and/or simulated IP data can be calculated.

In 630, best estimate data can be selected in real-time from a hot-spot-related library. The selected best estimate data can be a data point of the hot-spot-related library with a hot-spot data substantially close to the simulated evaluation data, or with IP data substantially close to the simulated IP data, or with contrast data substantially close to the simulated contrast data, or any combination thereof. The selected best estimate data can include risk, data, confidence data, yield data, and an optimization technique can be performed to select the best estimate data.

In 635, the best estimate data can be compared to the simulated evaluation data from one or more of the simulated evaluation fields. Differences can be obtained and compared to hot-spot library accuracy limits. For example, when the difference is very small, this means that the simulated evaluation data substantially the same as the best estimate data already in the hot-spot library; when the difference is larger, this means that the simulated evaluation data is close to but not exactly the same as the best estimate data already in the hot-spot library, and new best estimate data can be obtained from the hot-spot library; and when the difference is large, this means that the simulated evaluation data is not close to the best estimate data already in the hot-spot library, and new best estimate data can be created and put into the hot-spot library.

In 640, when the difference is small the simulated evaluation data can be identified using the best estimate data. For example, the simulated hot-spot pattern and/or structure can be identified using the best estimate hot-spot pattern and/or structure and the simulated contrast data and/or simulated IP data can be identified using the best estimate contrast data and/or simulated IP data. In addition, the first layout can be identified as a hot-spot-containing layout if the differences are small, and the first layout can be identified using the hot-spot state associated with the hot-spot library data. The risk data, confidence data, or yield data, or any combination thereof that are associated with the first layout, the substrate, the first simulated processing sequence, or with the first set of design rules, or any combination thereof can be updated. In addition, yield data, process data, and/or confidence data can be updated.

In 645, when one or more differences are large, one or more corrective actions can be performed.

Some corrective actions can be performed, when best estimate data are not available, DOE techniques can be used to obtain new hot-spot-related data. The new hot-spot-related data can be compared to the simulated evaluation data from one or more of the simulated evaluation fields. Differences can be obtained and compared to hot-spot library creation limits. When one or more hot-spot library creation limits are met, the additional hot-spot-related data can be included into the hot-spot library and one or more additional hot-spot patterns and/or structures can be identified and stored as additional members of the hot-spot library. The first layout can be identified as a hot-spot-containing layout if one or more of the hot-spot library creation criteria are met.

In addition, when best estimate data are not available, real-time regression techniques can be used to obtain additional hot-spot-related data, and the additional hot-spot-related data can be compared to the simulated evaluation data from the one or more of the simulated evaluation fields. Differences can be obtained and compared to hot-spot library creation limits. When one or more new hot-spot library creation limits are met, the additional hot-spot-related data can be included into the hot-spot library and one or more new patterns and/or structures can be identified and stored as new members of the hot-spot library. The first layout can be identified as a hot-spot-containing layout if one or more of the hot-spot library creation criteria are met.

The data in the hot-spot library can include contrast data, and the contrast images in the hot-spot library can be associated with one or more hot-spot patterns and/or structures, and the hot-spot patterns and/or structures can have IP data associated therewith. For example, the IP data can include threshold IP values, minimum IP values, maximum IP values, and linearized IP values. In addition, yield data, risk data, confidence data, or hot-spot state data, or any combination thereof can be associated with each hot-spot pattern and/or structure.

The hot-spot library creation criteria can include Goodness of Fit (GOF) data, creation rules data, process data, historical data, threshold data, confidence data, risk data, yield data, or accuracy data, or any combination thereof. In addition, hot-spot library creation rules can be specified by a user, by the processing sequence, by the substrate type and/or state, or by the design rules.

In some DOE examples, one or more hot-spot patterns and/or structures can be created in a test mask, and one or more areas of a photoresist layer can be exposed on a substrate using the test mask and a radiation source. In addition, one or more areas of the exposed photoresist layer can include one or more evaluation fields that can have a latent image of a hot-spot pattern and/or structure therein. Alternatively, evaluation fields may not be required. The exposed photoresist layer can also include the latent images for the first set of structures on the substrate. Subsequently, the test mask can be used to establish other evaluation fields and additional hot-spot patterns over additional portions of the substrate. For example, step and repeat techniques can be performed by one or more scanner-related subsystems. In addition, other hot-spot patterns and/or structures can be created using additional test masks.

In other DOE examples, one or more hot-spot patterns and/or structures can be created in one or more areas of a photoresist layer on a substrate using over-exposure and/or under-exposure procedures. In addition, one or more areas of the exposed photoresist layer can include one or more evaluation fields that can have a latent image of an over-exposed or under-exposed hot-spot pattern therein. Alternatively, evaluation fields may not be required. The over-exposed or under-exposed photoresist layer can also include the latent images for other over-exposed or under-exposed structures on the substrate. For example, a test mask can be used during the over-exposure and/or under-exposure procedures, and step and repeat techniques can be performed by one or more scanner-related subsystems. In addition, other exposure-related hot-spot patterns can be created using additional masks and/or exposure sources.

In additional DOE examples, one or more hot-spot patterns can be created in one or more areas of a photoresist layer on a substrate using different focusing procedures. In addition, one or more areas of the exposed photoresist layer can include one or more evaluation fields that can have a latent image of a hot-spot pattern therein that was created using an incorrect focusing procedure. Alternatively, evaluation fields may not be required. The exposed photoresist layer can also include out-of-focus latent images for other structures on the substrate. For example, a test mask can be used during the different focusing procedures, and step and repeat techniques can be performed by one or more scanner-related subsystems. In addition, other focus-related hot-spot patterns can be created using additional masks and/or exposure sources.

In some other DOE examples, one or more hot-spot patterns and/or structures can be created in one or more areas of a photoresist layer on a substrate using different developing procedures. In addition, one or more areas of the exposed photoresist layer can include one or more evaluation fields that can have a latent image of a hot-spot pattern therein that was created using an incorrect developing procedure. Alternatively, evaluation fields may not be required. The exposed photoresist layer can also include latent images for other structures that were created on the substrate using the incorrect developing procedure. For example, a test mask can be used during the different developing procedures, and step and repeat techniques can be performed by one or more scanner-related subsystems. In addition, other developing-related hot-spot patterns and/or structures can be created using additional masks and/or exposure sources.

During the different developing procedures, different photoresists can be used, different developing chemistries can be used, different developing times can be used, different thermal procedures can be used, and different pre-exposure procedures can be used. In addition, when analyzing the different developing procedures, different photoresist models can be used, different developing chemistry models can be used, different developing time models can be used, different thermal procedure models can be used, and different pre-exposure models can be used.

In other examples, one or more alignment procedures can be performed to create overlay-related hot-spot patterns and/or structures. For example, offset errors between two or more masks steps can be used to create overlay hot-spot patterns and/or structures. In addition, one or more correct alignment procedures can be performed to establish reference data.

When evaluation data is obtained, one or more beams can be established using one or more optical sources, and the one or more beams can have one or more angles associated with them. The one or more beams can be polarized or non-polarized and can have a single wavelength or multiple wavelengths. One or more of the beams can be used to illuminate a first hot-spot pattern and/or structure in a first evaluation field. Alternatively, evaluation fields may not be required. For example, evaluation sites may be used. One or more aerial images can be obtained from one or more of the evaluation fields, and one or more image parameters can be determined.

A simulated circuit layout can be created using the first layout data, an exposure-related model, a hot-spot creation model, and a simulated processing sequence. The exposure-related model can include wet and/or dry exposure data. A masking layer model can include a photoresist layer model, an ARC layer model, or a BARC layer model, or any combination thereof.

In some embodiments, performing corrective actions can include a) selecting a new evaluation field in the simulated test layout using first risk data associated with the simulated processing sequence, second risk data associated with the first set of design rules, or third risk data associated with the masking layer model, or any combination thereof, wherein the new evaluation field in the simulated test layout comprises a new simulated test pattern that was created by the simulated processing sequence, wherein the simulated processing sequence and the first set of design rules have yield data associated therewith, the simulated processing sequence being performed with a first set of simulated processing tools, or simulated processing parameters, or any combination thereof; b) obtaining new simulated evaluation data from the first evaluation field in the simulated test layout, the new simulated evaluation data including one or more new simulated contrast images and at least one new simulated IP values; c) obtaining new best estimate data in real-time from the hot-spot library, wherein the new best estimate data includes one or more new best estimate contrast images, or one or more new best estimate IP values, or any combination thereof; d) determining new differences between the new simulated evaluation data and the new best estimate data; e) comparing the new differences to one or more new hot-spot library creation limits; f) updating the hot-spot library, when one or more hot-spot library creation limits are met, wherein one or more of the new simulated test patterns are identified as new process hot-spot patterns and are stored in the hot-spot library; performing a new corrective action when one or more of the new hot-spot library creation limits are not met; h) repeating steps a)-g), when new evaluation fields are available in the simulated test layout; and i) storing the substrate, when new evaluation fields are not available in the simulated test layout.

In other embodiments, performing corrective actions can include obtaining new layout data, wherein the new layout data comprises a new test layout established for a first layer of a new substrate and created by the first layout tool using the first set of design rules; creating a new simulated test layout using the new layout data, a new masking layer model, and a new simulated processing sequence, wherein the new masking layer model includes a new photoresist layer model, a new anti-reflective coating (ARC) layer model, or a new bottom anti-reflective coating (BARC) layer model, or any combination thereof; selecting a new evaluation field in the new simulated test layout for the new substrate using new first risk data associated with the new simulated processing sequence, second risk data associated with the first set of design rules, or new third risk data associated with the new masking layer model, or any combination thereof, wherein the new evaluation field in the new simulated test layout comprises a new simulated test pattern that was created by the new simulated processing sequence, wherein the new simulated processing sequence has new risk data associated therewith, the new simulated processing sequence being performed with a new set of simulated processing tools, or new simulated processing parameters, or any combination thereof; obtaining new simulated evaluation data for the new substrate using the new evaluation field in the new simulated test layout, the new simulated evaluation data including one or more new simulated contrast images and at least one new simulated IP values; obtaining new best estimate data in real-time for the new substrate from the hot-spot library, wherein the new best estimate data includes one or more new best estimate contrast images, or one or more new best estimate IP values, or any combination thereof; determining new differences for the new substrate using the new simulated evaluation data and the new best estimate data; comparing the new differences to one or more new hot-spot library creation limits; updating the hot-spot library, when one or more new hot-spot library creation limits are met, wherein one or more of the new simulated test patterns are identified as process hot-spot patterns and are stored in the hot-spot library; and performing a new corrective action when one or more of the new hot-spot library creation limits are not met.

In some embodiments, the method for obtaining simulated evaluation data from the first evaluation field can include: simulating a first beam using a simulated optical source, the simulated first beam having a first incident angle; illuminating the first hot-spot pattern in the first evaluation field using the simulated first beam; obtaining a first simulated aerial image for the first hot-spot pattern; determining a simulated maximum IP value for the first hot-spot pattern; determining a simulated minimum IP value for the first hot-spot pattern; determining a simulated threshold IP value for the first hot-spot pattern; determining a first simulated best fit curve using the simulated maximum IP value, the simulated minimum IP value, and the simulated threshold IP value; and identifying the first hot-spot pattern using the first simulated best fit curve.

Verified and/or reference hot-spot creation sequences can be used to create verified and/or reference hot-spot patterns and/or structures, and the verified hot-spot creation sequences can be stored in a hot-spot library. When a verified hot-spot creation sequence is performed, one or more reference (verified) hot-spot patterns and/or structures can be created at one or more sites on each of the processed substrates. When an unverified hot-spot creation procedure is performed, one or more unverified hot-spot patterns and/or structures can be created at one or more sites on each of the processed substrates.

In some embodiments, a first group of substrates can be established that can be used to obtain the hot-spot library data. The data from the first group of substrates can be used for creating, updating, and/or verifying data in the hot-spot library. The first group can include one or more test and/or verification substrates, and a number of required verification sites can be established for each substrate. For example, a verification substrate can be produced using verified hot-spot creation procedures performed using verified processing elements and/or evaluation elements, and after a verified hot-spot creation sequence is performed, one or more "reference" hot-spot patterns and/or structures can be produced at one or more sites on each of the processed substrates. In addition, simulated and/or predicted data can be established for one or more process hot-spot patterns and/or structures at one or more sites on one or more substrates.

When a good resist model has been developed, image parameter (IP) relationships can be used that includes the image contrast, resist kinetics and resist dissolution contrast. Low contrast imaging at IP threshold is more sensitive to immersion driven PAG loss. The scanner induces a non-uniform distribution of water contact time to the resist (including residual water droplets). Hot spot patterns and/or structures can include bridging defects, line width resolution (LWR) issues, and local CD variations.

When water flows over a resist coated wafer, resist components can diffuse into the flowing water if preventive measures are not taken. The fluid dynamics (flow profile) can affect the diffusion rate and/or the convection rate. The fluid dynamics (flow profile) can also affect the photo acid generator (PAG) concentration profile.

When validation and/or evaluation decisions cannot be made using data from a first substrate one or more additional substrates can be used. When defective substrates are identified, the values for the defective substrate state may include "repairable", "non-repairable, "repair entire lot:", "scrap entire lot", and "stop the processing". When defective circuit layouts are identified, the values for the defective layout state may include "repairable", "non-repairable, "change design rules", "change model", "change processing sequences", "change selected subsystem" and "stop the processing".

Figure 7:
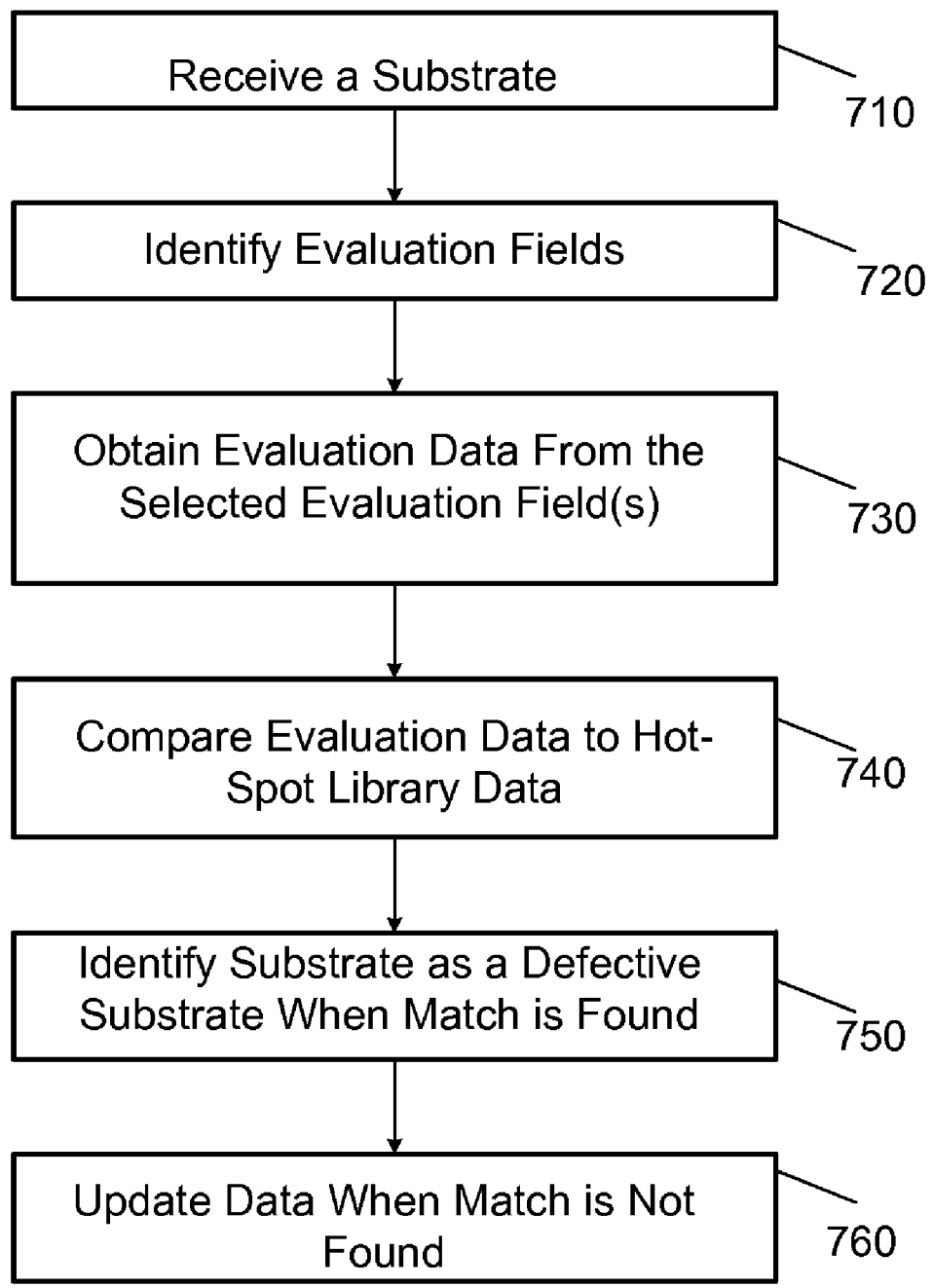
FIG. 7 shows an exemplary flow diagram of another procedure for processing substrates in accordance with embodiments of the invention.

FIG. 7 illustrates an exemplary procedure for processing a substrate using a hot-spot library in accordance with embodiments of the invention. In the illustrated embodiment, a procedure 700 is shown for identifying a defective substrate using a hot-spot library.

In 710, one or more substrates can be received by one or more subsystems, and the substrate can include a patterned layer. For example, one or more of the substrate can be test or send-ahead substrates. In various examples, the patterned layer can include a masking layer, a photoresist layer, an ARC layer, a BARC layer, an exposed layer, a developed layer, an etched layer, a deposited layer, an implant layer, a doping layer, a cleaned layer, or a polished layer, or any combination of layers.

A number of evaluation fields can be associated with the patterned layer, and each evaluation field can have contrast data associated therewith. For example, a patterned masking layer can be created using a first test processing sequence and can include a photoresist layer, an ARC layer, or a BARC layer, or any combination thereof.

In 720, a first set of evaluation fields can be identified on the substrate using first risk data associated with the first test processing sequence, and second risk data associated with the substrate. In addition, confidence and/or yield data can be used. Each evaluation field on the substrate can include one or more circuit layout patterns that were created using the first test processing sequence, and the first test processing sequence can have risk data associated therewith. For example, the test first processing sequence being performed with a first set of processing tools, or processing parameters, or any combination thereof;

In 730, evaluation data can be obtained in real time from the first set of evaluation fields, and the evaluation data can include at least one measured contrast image and one or more calculated IP values. The evaluation data can also include at least one simulated contrast image and one or more simulated IP values. In addition, the evaluation data can include historical contrast images and IP values.

In 740, the evaluation data can be compared to data in the hot-spot library.

In 750, the substrate can be identified as a defective substrate when a matching condition is found between the evaluation data and the data in the hot-spot library; and In 760, the risk data, confidence data, and/or yield data can be updated when the matching condition is not found.

The hot-spot library data can include data for single layer defects, multi-layer defects, partially-etched defects, etching defects, trimming defects, doping defects, target defects, capacitor defects, gate defects, transistor defects, defects in FinFET structures, defects in Complementary Metal-Oxide Semiconductor (CMOS) structures, defects in pFET structures, defects in nFET structures, defects in photoresists, defects in alignment targets, defects in trench structures, defects in via structures, defects in array structures, defects in grating structures, or any combination thereof.

In addition, when judgment and/or intervention rules are associated with procedures, they can be executed. Intervention and/or judgment rule evaluation procedures and/or limits can be performed based on historical procedures, on the customer's experience, or process knowledge, or obtained from a host computer. Hot-spot-related rules can be used in FDC procedures to determine how to respond to hot-spot condition, alarm conditions, error conditions, fault conditions, and/or warning conditions. The hot-spot-related FDC procedures can prioritize and/or classify faults, predict system performance, predict preventative maintenance schedules, decrease maintenance downtime, and extend the service life of consumable parts in the system.

A hot-spot-creation procedure can be specified by a semiconductor manufacturer based on data stored in a historical database. For example, a semiconductor manufacturer may have historically chosen a number of sites on the substrate when making SEM measurements and would like to correlate the hot-spot evaluation data to the data measured using a SEM system, TEM system and/or FIB system. In addition, the number of evaluation sites used can be reduced as the manufacturer becomes more confident that the process is and will continue to produce high quality products and/or devices.

Before, during, and/or after a procedure is performed, simulation, modeling and/or prediction data can be created and/or modified. The new simulation and/or prediction data can be used in real time to update the calculations, models, and/or procedures For example, prediction models can include process chemistry models, chamber models, EM models, SPC charts, PLS models, PCA models, FDC models, and Multivariate Analysis (MVA) models.

The historical data can include GOF data, thermal data, thickness data, via-related data, CD data, CD profile data, material related data, trench-related data, sidewall angle data, differential width data, or any combination thereof. The data can also include site result data, site number data, CD measurement flag data, number of measurement sites data, coordinate X data, and coordinate Y data, among others.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

Thus, the description is not intended to limit the invention and the configuration, operation, and behavior of the present invention has been described with the understanding that modifications and variations of the embodiments are possible, given the level of detail present herein. Accordingly, the preceding detailed description is not mean or intended to, in any way, limit the invention—rather the scope of the invention is defined by the appended claims.

What is claimed:

1. A method of creating data for a hot-spot library comprising:
    obtaining a first layout for a first layer of a substrate using a first set of design rules, wherein the first layout is a test layout from a layout tool;
    creating the test layout in a first masking layer on the substrate using a first reference processing sequence, wherein the first masking layer includes a photoresist layer, an anti-reflective coating (ARC) layer, or a bottom anti-reflective coating (BARC) layer, or any combination thereof;
    selecting a first evaluation field in the first masking layer using first data associated with the first reference processing sequence or second data associated with the first set of design rules, or any combination thereof, wherein the first evaluation field in the first masking layer comprises a first hot-spot pattern that was created using the first reference processing sequence, wherein the first reference processing sequence and the first set of design rules have yield data associated therewith, the first reference processing sequence being performed with a first set of reference processing tools, or reference processing parameters, or any combination thereof;
    obtaining evaluation data from the first evaluation field, wherein the first hot-spot pattern is measured in the first evaluation field, the evaluation data including one or more measured contrast images and at least one calculated Image Parameter (IP) value;
    obtaining best estimate data in real-time from the hot-spot library, wherein the best estimate data includes one or more best estimate contrast images, or one or more best estimate IP values, or any combination thereof;
    determining first differences between the evaluation data and the best estimate data;
    comparing the first differences to one or more first hot-spot library creation limits;
    updating the hot-spot library, when one or more of the first hot-spot library creation limits are met, wherein the first hot-spot pattern is identified and stored as a first member of the hot-spot library; and
    performing a first corrective action when at least one of the first hot-spot library creation limits are not met.

2. The method of claim 1, wherein the performing the first corrective action comprises:
    a) selecting a new evaluation field in the first masking layer using first data associated with the first reference processing sequence or second data associated with the first set of design rules, or any combination thereof, wherein the new evaluation field in the first masking layer comprises a new hot-spot pattern that was created using the first reference processing sequence, wherein the first reference processing sequence and the first set of design rules have yield data associated therewith, the first reference processing sequence being performed with the first set of reference processing tools, or the reference processing parameters, or any combination thereof;
    b) obtaining new evaluation data from the new evaluation field, wherein the new hot-spot pattern is measured in the new evaluation field, the new evaluation data including one or more new measured contrast images and at least one new calculated IP value;
    c) obtaining new best estimate data in real-time from the hot-spot library, wherein the new best estimate data includes one or more new best estimate contrast images, or one or more new best estimate IP values, or any combination thereof;
    d) determining new differences between the new evaluation data and the new best estimate data;
    e) comparing the new differences to one or more new hot-spot library creation limits;
    f) updating the hot-spot library, when one or more of the new hot-spot library creation limits are met, wherein the new hot-spot pattern is identified and stored as a new member of the hot-spot library;
    g) performing a new corrective action when one or more of the new hot-spot library creation limits are not met;
    h) repeating steps a)-g), when new evaluation fields are available; and
    i) storing the substrate, when new evaluation fields are not available.

3. The method of claim 1, wherein the performing the first corrective action comprises:
    a1) creating the first layout in a new first masking layer on a new substrate using a new reference processing sequence, wherein the new reference processing sequence comprises new yield data and at least one new process parameter;
    b1) selecting a new evaluation field in the new first masking layer on the new substrate using new first data associated with the new reference processing sequence or the second data associated with the first set of design rules, or any combination thereof, wherein the new evaluation field in the new masking layer comprises a new hot-spot pattern that was created using the new reference processing sequence, wherein the new reference processing sequence and the first set of design rules have yield data associated therewith, the new reference processing sequence being performed with a new set of reference processing tools, or new reference processing parameters, or any combination thereof;
    c1) obtaining new evaluation data from the new evaluation field on the new substrate, wherein the new hot-spot pattern is measured in the new evaluation field, the new evaluation data including one or more new measured contrast images and at least one new calculated IP values;
    d1) obtaining new best estimate data for the new substrate in real-time from the hot-spot library, wherein the new best estimate data includes one or more new best estimate contrast images, or one or more new best estimate IP values, or any combination thereof;

e1) determining new differences between the new evaluation data for the new substrate and the new best estimate data for the new substrate;

f1) comparing the new differences for the new substrate to one or more new hot-spot library creation limits;

g1) updating the hot-spot library, when one or more of the new hot-spot library creation limits are met, wherein one or more of the new hot-spot patterns are identified and stored as new members of the hot-spot library;

h1) performing a new corrective action when one or more of the new hot-spot library creation limits are not met;

i1) repeating steps a1)-h1), when new evaluation fields are available for the new substrate; and j1) storing the new substrate, when new evaluation fields are not available.

4. The method of claim 1, wherein the performing the first corrective action comprises:

obtaining new best estimate data in real-time from the hot-spot library, wherein the new best estimate data includes one or more new best estimate contrast images, or one or more new best estimate IP values, or any combination thereof;

determining new differences between the evaluation data and the new best estimate data;

comparing the new differences to one or more new hot-spot library creation limits;

updating the hot-spot library, when one or more of the new hot-spot library creation limits are met, wherein one or more first hot-spot patterns are identified and stored as new members of the hot-spot library; and performing a new corrective action when one or more of the new hot-spot library creation limits are not met.

5. The method of claim 1, wherein the performing the first corrective action comprises:

calculating simulation data in real-time using a simulation model, wherein the simulation data includes one or more simulated hot-spot patterns, one or more simulated contrast images, or one or more simulated IP values, or any combination thereof;

determining additional differences between the evaluation data and the simulation data;

comparing the additional differences to one or more additional hot-spot library creation limits;

updating the hot-spot library, when one or more of the additional hot-spot library creation limits are met, wherein one or more of the simulated hot-spot patterns are stored as new members of the hot-spot library; and performing an additional corrective action when one or more of the additional hot-spot library creation limits are not met.

6. The method of claim 1, wherein the test layout is created in the masking layer using one or more lithography-related procedures and one or more scanner-related procedures, wherein the first hot-spot pattern is created by a defective lithography-related procedure, or a defective scanner-related procedure, or a combination thereof.

7. The method of claim 1, wherein the first hot-spot pattern comprises one or more resist bridges, one or more collapsed resist features, one or more watermarks, one or more layout-related defects, or one or more particles, or any combination thereof.

8. The method of claim 1, wherein obtaining evaluation data from the first evaluation field further comprises:

establishing a first beam using a first optical source, the first beam having a first incident angle;

illuminating the first hot-spot pattern in the first evaluation field using the first beam;

obtaining a first aerial image for the first hot-spot pattern;

determining a maximum IP value for the first hot-spot pattern;

determining a minimum IP value for the first hot-spot pattern;

determining a threshold IP value for the first hot-spot pattern;

determining a first best-fit curve using the maximum IP value, the minimum IP value, and the threshold IP value; and identifying the first hot-spot pattern using the first best-fit curve.

* * * * *